(12) United States Patent
Asa

(10) Patent No.: US 7,596,425 B2
(45) Date of Patent: Sep. 29, 2009

(54) SUBSTRATE DETECTING APPARATUS AND METHOD, SUBSTRATE TRANSPORTING APPARATUS AND METHOD, AND SUBSTRATE PROCESSING APPARATUS AND METHOD

(75) Inventor: Fuminori Asa, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 676 days.

(21) Appl. No.: 10/860,267

(22) Filed: Jun. 2, 2004

(65) Prior Publication Data

US 2004/0261550 A1 Dec. 30, 2004

(30) Foreign Application Priority Data

Jun. 13, 2003 (JP) ............................. 2003-169874
Jun. 13, 2003 (JP) ............................. 2003-169875
Mar. 31, 2004 (JP) ............................. 2004-102675
Mar. 31, 2004 (JP) ............................. 2004-102676

(51) Int. Cl.
*G07F 7/00* (2006.01)

(52) U.S. Cl. ..................................... 700/213; 73/865.9
(58) Field of Classification Search ................. 700/228, 700/213; 73/865.9
See application file for complete search history.

(56) References Cited

U.S. PATENT DOCUMENTS

| | | | | |
|---|---|---|---|---|
| 4,045,727 A | * | 8/1977 | Yu et al. ..................... | 324/644 |
| 4,344,160 A | | 8/1982 | Gabriel et al. | |
| 4,815,008 A | * | 3/1989 | Kadonoff et al. ............... | 701/23 |
| 4,845,530 A | * | 7/1989 | Matsukawa ................... | 355/53 |
| 4,999,336 A | * | 3/1991 | Nadkarni et al. ............. | 505/124 |
| 4,999,669 A | * | 3/1991 | Sakamoto et al. .............. | 355/53 |
| 5,130,852 A | * | 7/1992 | Hamanaka .................. | 359/741 |
| 5,293,179 A | * | 3/1994 | Ichikawa et al. .............. | 347/56 |
| 6,244,121 B1 | * | 6/2001 | Hunter ....................... | 73/865.9 |
| 6,468,816 B2 | * | 10/2002 | Hunter ......................... | 438/14 |
| 6,747,277 B2 | * | 6/2004 | Mori et al. ............. | 250/370.11 |

(Continued)

FOREIGN PATENT DOCUMENTS

JP 59-120858 7/1984

(Continued)

OTHER PUBLICATIONS

Notice of Reasons of Refusal issued Mar. 31, 2009 in corresponding Japanese Application No. 2004-102675 (JP59-120858 and the U.S. equivalent of JP2-28312 were previously cited by the Examiner in an Office Action mailed Oct. 10, 2007 and are therefore not submitted).

*Primary Examiner*—Patrick Mackey
*Assistant Examiner*—Michael E. Butler
(74) *Attorney, Agent, or Firm*—Ostrolenk Faber LLP

(57) ABSTRACT

A substrate is supported by planes of four substrate supporters arranged on the top surface of a transport arm. Three ultrasonic distance measuring sensors are fixed on a fixing base arranged above the substrate. The three ultrasonic distance measuring sensors are arranged to measure the distances to the top surface of the substrate in the vicinity of its periphery. In this case, the ultrasonic distance measuring sensors are positioned so that measurement values of the ultrasonic distance measuring sensors may become equal to each other with the substrate being normally supported. The ultrasonic distance measuring sensors each measure the distances to the top surface of the substrate to supply the measurement values to a controller.

10 Claims, 23 Drawing Sheets

U.S. PATENT DOCUMENTS

| | | | |
|---|---|---|---|
| 6,856,388 B2 * | 2/2005 | Schmidt | 356/152.2 |
| 6,891,380 B2 * | 5/2005 | Kesil et al. | 324/635 |
| 6,947,128 B2 * | 9/2005 | Basiji et al. | 356/73 |
| 7,117,913 B2 * | 10/2006 | Sasaki | 156/358 |
| 7,187,063 B2 * | 3/2007 | Adachi et al. | 257/666 |
| 7,270,021 B2 * | 9/2007 | Shimamura et al. | 73/865.8 |
| 2005/0200529 A1 * | 9/2005 | Watanabe | 343/700 MS |
| 2006/0152682 A1 * | 7/2006 | Matsuda et al. | 353/40 |
| 2007/0001905 A1 * | 1/2007 | Eronen | 342/463 |

FOREIGN PATENT DOCUMENTS

| | | |
|---|---|---|
| JP | 59-120858 A * | 7/1984 |
| JP | 2-28312 | 1/1990 |
| JP | 3-70365 | 11/1991 |
| JP | 5-129185 | 5/1993 |
| JP | 9-326351 | 12/1997 |
| JP | 10-173030 | 6/1998 |

* cited by examiner

F I G. 1 4
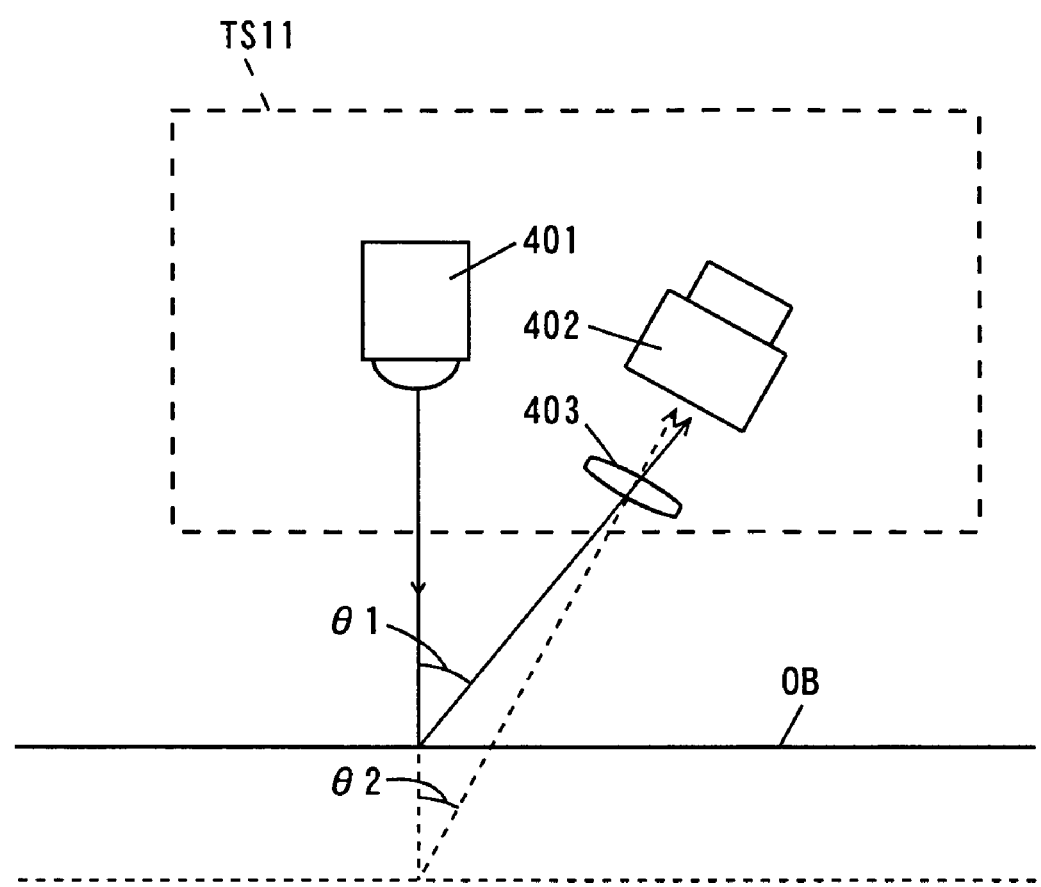

F I G. 1 6
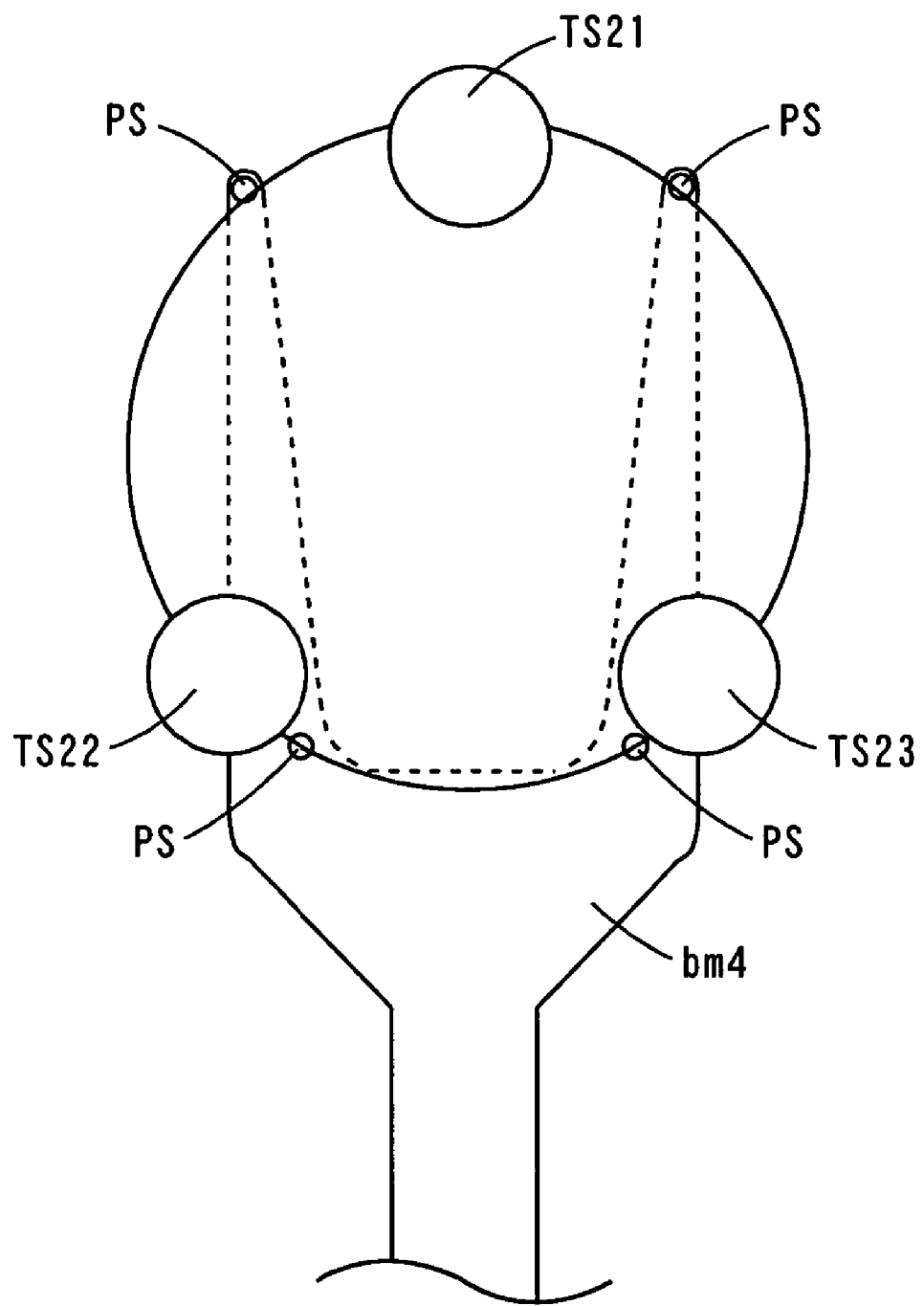

SUBSTRATE DETECTING APPARATUS AND METHOD, SUBSTRATE TRANSPORTING APPARATUS AND METHOD, AND SUBSTRATE PROCESSING APPARATUS AND METHOD

BACKGROUND OF THE INVENTION

1. Field of the Invention

The present invention relates to a substrate detecting apparatus and method for detecting a substrate, a substrate transporting apparatus and method for transporting the substrate, and a substrate processing apparatus and method for processing the substrate.

2. Description of the Background Art

A substrate processing apparatus is used for subjecting a substrate such as a semiconductor wafer, a glass substrate for liquid crystal display, a glass substrate for photomask, and a glass substrate for optical disc to a variety of processings. In the fabrication process of a semiconductor device, for example, a substrate processing apparatus is used in which each of a series of processings is unitized for improved productivity, and the plurality of processing units are integrated.

In the substrate processing apparatus, one substrate is, in general, successively subjected to a plurality of different processings. Accordingly, a substrate transport robot for transporting a substrate from one unit to another is provided.

FIG. 23 is a perspective view showing an example of the conventional substrate processing apparatus 500 (refer to, for example, JP 2001-82653 A).

The substrate processing apparatus 500 shown in FIG. 23 performs a series of processings, such as coating processing, developing processing, heat processing, and cooling processing. The apparatus has a processing region A at the bottom side of the paper of FIG. 23; a processing region B at the top side; and a transport region C between the processing regions A and B.

In the processing region A, a spin coating unit (spin coater) SC for coating a substrate W with a processing liquid, and a spin developing unit (spin developer) SD for performing developing processing to the substrate W are arranged. In the processing region B, a heating unit (hotplate) HP for performing heat processing to the substrate W, and a cooling unit (cooling plate) for performing cooling processing to the substrate W are arranged. A substrate transport robot 60 is movably provided in the transport region C. Further, an indexer ID for substrate loading and unloading is arranged at one ends of the processing regions A, B.

The indexer ID is provided with an indexer robot 51 for transferring the substrates W between a plurality of cassettes 1 which store the substrates W and the substrate transport robot 60 provided in the transport region C. The transfer of substrates W between the substrate transport robot 60 and indexer robot 51 takes place in a transfer portion TP.

In other words, while moving in the direction of arrow U, the indexer robot 51 of the indexer ID takes out a substrate W from a cassette 1 to transfer it to the substrate transport robot 60 in the transfer portion TP, and reversely receives a substrate W which has undergone the series of processings from the substrate transport robot 60 in the transfer portion TP to return it to a cassette 1.

The substrate transport robot 60 has a transport arm 61, and transports the substrate W transferred from the indexer robot 51 to a designated processing unit or transports the substrate W received from one processing unit to another or to the indexer robot 51.

In the conventional substrate transport apparatus 500, the substrate W can thus undergo the series of processings while being transported to each of the processing units by the substrate transport robot 60 and the indexer robot 51.

In recent years, however, each of the processing units and the substrate transport apparatus are increasing in size with a trend in upsizing a substrate. The upsizing of a substrate has led to an increase in the production cost per substrate, and potential dropping or breakage of a substrate caused by poor transportation may result in increasing the cost.

In the conventional substrate transport apparatus 500, for example, if the substrate W is placed on the transport arm without being supported by some of a plurality of support pins provided on the transport arm, the substrate W will be inserted into each of the processing units while being in an inclined attitude. In this case, the substrate is held improperly in each of the processing units, which causes part of the substrate W left unprocessed, or breakage in the substrate W.

For this reason, optical sensors are used for the detection of positional deviation of the substrate W. However, in some cases where translucent materials such as glass are used for the substrates W, it is difficult to accurately determine the attitudes of a variety of substrates W using such optical sensors.

SUMMARY OF THE INVENTION

An object of the present invention is to provide a substrate detecting apparatus and a substrate detecting method which enable accurate detection of inclined attitudes of a variety of substrates.

Another object of the present invention is to provide a substrate transporting apparatus and a substrate transporting method which enable accurate detection of inclined attitudes of a variety of substrates.

Still another object of the present invention is to provide a substrate processing apparatus and a substrate processing method which enable accurate detection of inclined attitudes of a variety of substrates.

Still an other object of the present invention is to provide a substrate processing apparatus and a substrate processing method which enable detection of the state of a substrate with a simple structure.

A substrate detecting apparatus according to one aspect of the present invention is a substrate detecting apparatus for detecting an inclined state of a substrate with respect to a horizontal plane, comprising: a supporting device that supports a substrate; and a detector that detects the inclined state of the substrate by measuring a distance to the surface of the substrate supported by the supporting device.

In the substrate detecting apparatus, the substrate is supported by the supporting device, and the distance to the surface of the substrate is measured by the detector. This enables accurate detection of the inclined attitude of the substrate with respect to the horizontal plane.

The detector may include an ultrasonic distance measuring sensor. In this case, ultrasonic transmitted from the ultrasonic distance measuring sensor is reflected on the surface of the substrate, and the reflected ultrasonic is received by the ultrasonic distance measuring sensor, so that the distance to the surface of the substrate is measured.

Note that the ultrasonic is reflected on the surface of an object whether or not the object is transparent. Accordingly, using the ultrasonic distance sensor, the distance to the surface of the substrate can be accurately measured whether or not the substrate is transparent. This enables accurate detection of the inclined state of the substrate with respect to the horizontal plane, based on the distance to the surface of the substrate.

The detector may include a laser distance measuring sensor. In this case, a laser beam emitted from the laser distance measuring sensor is reflected on the surface of the substrate, and the reflected light is received by the laser distance measuring sensor, so that the distance to the surface of the substrate is measured.

Note that the laser distance measuring sensor is capable of measuring the distance to an object with a high resolution. Accordingly, using the laser distance measuring sensor, the distance to the surface of the substrate can be accurately measured. This enables accurate detection of the inclined state of the substrate with respect to the horizontal plane, based on the distance to the surface of the substrate.

The detector may include a microwave distance measuring sensor. In this case, a microwave transmitted from the microwave distance measuring sensor is reflected on the surface of the substrate, and the reflected microwave is received by the microwave distance measuring sensor, so that the distance to the surface of the substrate is measured.

Note that the microwave is reflected on the surface of an object whether or not the object is transparent. Accordingly, using the microwave distance measuring sensor, the distance to the surface of the substrate can be measured whether or not the substrate is transparent. This enables accurate detection of the inclined state of the substrate with respect to the horizontal plane, based on the distance to the surface of the substrate.

The detector may measure distances to at least three measurement points on the substrate supported by the supporting device to calculate spacial coordinates of the at least three measurement points, thereby detecting the inclined state of the substrate based on the calculated spacial coordinates.

In this case, the distances to the at least three measurement points on the surface of the substrate are measured, and the special coordinates of the at least three measurement points are calculated. Based on the spacial coordinates of the at least three measurement points, the inclined state of the substrate is then detected. This enables more accurate detection of the inclined state of the substrate with respect to the horizontal plane.

The detector may include: a distance measuring sensor that measures as a reference value a distance to the surface of the substrate substantially horizontally supported by the supporting device, and subsequently measures as a measurement value a distance to the surface of the substrate supported by the supporting device; and a determiner that determines the inclined state of the substrate based on a difference between the reference value obtained from the distance measuring sensor and the measurement value obtained from the distance measuring sensor.

In this case, the distance to the surface of the substrate substantially horizontally supported is measured as the reference value in advance, and subsequently, the distance to the surface of the substrate supported by the supporting device is measured as the measurement value by the distance measuring sensor, the inclined state of the substrate being determined based on the difference between the reference value and measurement value. Accordingly, the inclined state of the substrate can be more accurately determined, irrespective of the precision in positioning the distance measuring sensor.

The detector may include three or more distance measuring sensors that measure the distances to the surface of the substrate supported by the supporting device.

In this case, the distance to the surface of the substrate can be measured by the three or more distance measuring sensors. This enables accurate detection of the presence/absence of an inclination of the substrate, a direction of inclination of the substrate, and an angle of inclination of the substrate.

The detector may include: a distance measuring sensor that measures the distance to the surface of the substrate supported by the supporting device; and a moving device that moves the distance measuring sensor relative to the substrate supported by the supporting device.

In this case, the moving device moves the distance measuring sensor, so that the distances to arbitrary positions on the surface of the substrate can be measured. This enables accurate detection of the presence/absence of the inclination of the substrate, the direction of inclination of the substrate, and the angle of inclination of the substrate.

The detector may detect the presence/absence of an inclination of the substrate as the inclined state of the substrate supported by the supporting device.

In this case, an abnormality in the inclined state of the substrate can be determined. This enables processing to be ceased or the attitude of the substrate be corrected when the inclined state of the substrate is abnormal.

The detector may detect a direction of inclination of the substrate as the inclined state of the substrate supported by the supporting device.

This enables correction of the attitude of the substrate based on the direction of inclination of the substrate.

The detector may detect an angle of inclination of the substrate as the inclined state of the substrate supported by the supporting device.

This enables the correction of the attitude of the substrate based on the angle of inclination of the substrate.

The substrate detecting apparatus may further comprise a determiner that determines that the inclined state of the substrate is abnormal when the angle detected by the detector is not less than a predetermined value.

In this case, the processing can be ceased or correction of the substrate attitude can be made when the inclined state of the substrate is abnormal.

The substrate detecting apparatus may further comprise a correction mechanism that corrects a state of the substrate supported by the supporting device based on the inclined state of the substrate detected by the detector.

In this case, because of the correction of the inclined state of the substrate, it is possible to proceed with the substrate processing.

The correction mechanism may include: an abutting member; and a controller that corrects the inclined state of the substrate supported by the supporting device by allowing the substrate supported by the supporting device to abut the abutting member.

In this case, the substrate supported by the supporting device is allowed to abut the abutting member, so that the inclined state of the substrate can be easily corrected.

A substrate transporting apparatus according to another aspect of the present comprises: a supporting device that supports a substrate; a transport mechanism that transports the substrate supported by the supporting device; and a detector that detects the inclined state of the substrate by measuring the distance to the surface of the substrate supported by the supporting device.

In the substrate transporting apparatus, the substrate supported by the supporting device is transported by the transport mechanism, while the distance to the surface of the substrate is measured by the detector. This enables accurate detection of the inclined state of the substrate with respect to the horizontal plane.

A substrate processing apparatus for processing a substrate according to still another aspect of the present invention comprises: a processing unit that processes a substrate while supporting the substrate; a transport device that transports the substrate between the processing unit and a predetermined position while supporting the substrate; and a detector that detects an inclined state of the substrate with respect to a horizontal plane by measuring a distance to the surface of the substrate supported by the processing unit or the transport device.

In the substrate processing apparatus, the substrate is processed while being supported in the processing unit. Also, the substrate is transported between the processing unit and the predetermined position while being supported by the transport device. Furthermore, the distance to the surface of the substrate supported by the processing unit or transport device is measured by the detector. This enables accurate detection of the inclined state of the substrate with respect to the horizontal plane.

A substrate detecting method for detecting an inclined state of a substrate with respect to a horizontal plane according to still another aspect of the present invention comprises the steps of: supporting a substrate; and detecting an inclined state of the substrate by measuring a distance to the surface of the supported substrate.

In the substrate detecting method, the substrate is supported, and the distance to the surface of the substrate is measured. This enables accurate detection of the inclined state of the substrate with respect to the horizontal plane.

A substrate transporting method for transporting a substrate according to still another aspect of the present invention comprises the steps of: transporting a substrate and; detecting an inclined state of the substrate with respect to a horizontal plane by measuring a distance to the surface of the substrate when transporting the substrate.

In the substrate transporting method, the distance to the surface of the substrate is measured by the detector during substrate transport. This enables accurate detection of the inclined state of the substrate with respect to the horizontal plane.

A substrate processing method for processing a substrate according to still another aspect of the present invention comprises the steps of: processing a substrate supported in a processing unit; transporting the substrate between the processing unit and a predetermined position with the substrate being supported by a transport device; and detecting an inclined state of the substrate with respect to a horizontal plane by measuring a distance to the surface of the substrate supported by the transport device or in the processing unit.

In the substrate processing method, the substrate is processed while being supported in the processing unit. Also, the substrate is transported between the processing unit and the predetermined position while being supported by the transport device. Further, the distance to the surface of the substrate supported in the processing unit or by the transport device is measured. This enables accurate detection of the inclined state of the substrate with respect to the horizontal plane.

A substrate processing apparatus for processing a substrate according to still another aspect of the present invention comprises: a plurality of processing units that process a substrate; a transfer position for transferring the substrate; a first transport device that transports the substrate between the transfer portion and a predetermined position while supporting the substrate; a second transport device that transports the substrate between the transfer position and any of the plurality of processing units while supporting the substrate; and a detector provided in the transfer position that detects an inclined state of the substrate supported by the first or second transport device with respect to a horizontal plane.

In the substrate processing apparatus, the substrate is processed by the plurality of processing units. The substrate is transported between the transfer position and the predetermined position while supported by the first transport device. Also, the substrate is transported between the transfer position and any of the plurality of processing units while being supported by the second transport device. Further, in the transfer position, a detection is made for the inclined state of the substrate supported by the first or second transport device with respect to the horizontal plane.

In this way, the inclined state of the substrate with respect to the horizontal plane can be detected with a simple structure in the substrate transfer position between the first transport device and the second transport device. This obviates partly unprocessed substrates in each of the processing units and the breakage in substrates.

The detector may detect the presence/absence of an inclination of the substrate as the inclined state of the substrate supported by the first or second transport device.

In this case, an abnormality in the inclined state of the substrate can be determined. This enables a warning of the abnormality, processing to be ceased, and correction of the substrate attitude (inclined state) when the inclined state of the substrate is abnormal.

The detector may detect a direction of inclination of the substrate as the inclined state of the substrate supported by the first or second transport device.

This enables correction of the substrate attitude based on the direction of inclination of the substrate. The method for dealing with the abnormality can also be changed based on the direction of inclination of the substrate.

The detector may detect an angle of inclination of the substrate as the inclined state of the substrate supported by the first or second transport device.

This enables correction of the substrate attitude based on the angle of inclination of the substrate. The method for dealing with the abnormality can also be changed based on the angle of inclination of the substrate.

The substrate processing apparatus may further comprise a determiner that determines that the inclined state of the substrate is abnormal when the angle detected by the detector is not less than a predetermined value.

In this case, when the inclined state of the substrate is abnormal, a warning can be given of the abnormality, the processing can be ceased, and the substrate attitude can be corrected.

The detector may detect the inclined state of the substrate by measuring a distance to the surface of the substrate supported by the first or second supporting device. In this case, the detector measures the distance to the surface of the substrate, so that an accurate detection is made for the inclined state of the substrate supported by the first or second transport device.

The detector may include an ultrasonic distance measuring sensor that measures the distance to the surface of the substrate.

In this case, ultrasonic transmitted from the ultrasonic distance measuring sensor is reflected on the surface of the substrate, and the reflected ultrasonic is received by the ultrasonic distance measuring sensor, so that the distance to the surface of the substrate is measured.

Note that the ultrasonic is reflected on the surface of an object whether or not the object is transparent. Accordingly, using the ultrasonic distance sensor, the distance to the surface of the substrate can be accurately measured whether or not the substrate is transparent. This enables accurate detection of the inclined state of the substrate with respect to the horizontal plane, based on the distance to the surface of the substrate.

The detector may include a laser distance measuring sensor that measures the distance to the surface of the substrate. In this case, a laser beam emitted from the laser distance measuring sensor is reflected on the surface of the substrate, and the reflected light is received by the laser distance measuring sensor, so that the distance to the surface of the substrate is measured.

Note that the laser distance measuring sensor is capable of measuring the distance to an object with a high resolution. Accordingly, using the laser distance measuring sensor, the distance to the surface of the substrate can be accurately measured. This enables accurate detection of the inclined state of the substrate with respect to the horizontal plane, based on the distance to the surface of the substrate.

The detector may include a microwave distance measuring sensor that measures the distance to the surface of the substrate. In this case, a microwave transmitted from the microwave distance measuring sensor is reflected on the surface of the substrate, and the reflected microwave is received by the microwave distance measuring sensor, so that the distance to the surface of the substrate is measured.

Note that the microwave is reflected on the surface of an object whether or not the object is transparent. Accordingly, using the microwave distance measuring sensor, the distance to the surface of the substrate can be measured whether or not the substrate is transparent. This enables accurate detection of the inclined state of the substrate with respect to the horizontal plane, based on the distance to the surface of the substrate.

The detector may measure distances to at least three measurement points on the substrate supported by the supporting device to calculate spacial coordinates of the at least three measurement points, thereby detecting the inclined state of the substrate based on the calculated spacial coordinates.

In this case, the distances to the at least three measurement points on the surface of the substrate are measured, and the spacial coordinates of the at least three measurement points are calculated. Based on the spacial coordinates of the at least three measurement points, the inclined state of the substrate is then detected. This enables more accurate detection of the inclined state of the substrate with respect to the horizontal plane.

The detector may include: a distance measuring sensor that measures as a reference value a distance to the surface of the substrate substantially horizontally supported by the first or second supporting device, and subsequently measures as a measurement value a distance to the surface of the substrate supported by the first or second supporting device; and a determiner that determines the inclined state of the substrate based on a difference between the reference value obtained from the distance measuring sensor and the measurement value obtained from the distance measuring sensor.

In this case, the distance to the surface of the substrate substantially horizontally supported is measured as the reference value in advance, and subsequently, the distance to the surface of the substrate supported by the first or second supporting device is measured as the measurement value by the distance measuring sensor, the inclined state of the substrate being determined based on the difference between the reference value and measurement value. Accordingly, the inclined state of the substrate can be more accurately determined, irrespective of the precision in positioning the distance measuring sensor.

The detector may include three or more distance measuring sensors that measure distances to the surface of the substrate.

In this case, the distances to at least three points on the surface of the substrate can be measured. This enables accurate detection of the presence/absence of an inclination of the substrate, a direction of inclination of the substrate, and an angle of inclination of the substrate.

The detector may include: a distance measuring sensor that measures the distance to the surface of the substrate; and a moving device that moves said distance measuring sensor relative to the substrate.

In this case, the moving device moves the distance measuring sensor, so that measurements can be made of the distance(s) to an arbitrary one position or a plurality of positions on the surface of the substrate. For example, measurements of the distances to at least three positions on the surface of the substrate enable accurate detection of the presence/absence of an inclination of the substrate, a direction of inclination of the substrate, and an angle of inclination of the substrate.

The detector may include: a light emitter that emits a light of predetermined width from one end of the substrate supported by the first or second transport device in the transfer position to another end thereof along a direction of the surface of the substrate; and a light receiver that receives the light emitted by the light emitter at the another end side, the detector detecting the inclined state of the substrate supported by the first or second transport device based on a width of the light received by the light receiver.

In this case, part of the light emitted from the light emitter is blocked by the substrate. Because the width of the blocked light varies depending on the inclined state of the substrate, the inclined state of the substrate can be detected based on the width of the light received by the light receiver.

The substrate processing apparatus may further comprise a correction mechanism that corrects the inclined state of the substrate supported by the first or second transport device based on the inclined state of the substrate detected by the detector.

In this case, because of the correction of the inclined state of the substrate, it is possible to proceed with the substrate processing.

The correction mechanism may include: an abutting member; and a controller that corrects the inclined state of the substrate supported by the first or second transport device by allowing the substrate supported by the first or second transport device to abut the abutting member.

In this case, the substrate supported by the first or second supporting device is allowed to abut the abutting member, so that the inclined state of the substrate can be easily corrected. Note that in order that the substrate abuts the abutting member, the substrate may be moved in the direction of the abutting member by the first or second transport device, or the abutting member may be moved in the direction of the substrate held by the first or second transport device.

A substrate processing method according to another aspect of the present invention comprises the steps of: processing a substrate in each of a plurality of processing units; transporting the substrate between a transfer position and a predetermined position with the substrate being supported by a first transport device; transporting the substrate between the transfer position and any of the plurality of processing units with the substrate being supported by a second transport device; and detecting in the transfer position an inclined state of the substrate supported by the first or second transport device with respect to a horizontal plane.

In the substrate processing method, the substrate is processed by the plurality of processing units. The substrate is transported between the transfer position and the predetermined position while being supported by the first transport device. Also, the substrate is transported between the transfer position and any of the plurality of processing units while being supported by the second transport device. Further, in the transfer position, a detection is made for the inclined state of the substrate supported by the first or second transport device with respect to the horizontal plane.

In this way, the inclined state of the substrate with respect to the horizontal plane can be detected with a simple structure in the substrate transfer position between the first transport device and the second transport device. This obviates partly unprocessed substrates in each of the processing units and the breakage in substrates.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 14 is a schematic diagram for use in illustrating the structure and operating principle of the laser distance measuring sensor as shown in FIGS. 12 and 13;

FIG. 16 is a plan view showing still another example of a method for detecting the attitude of the substrate;

DESCRIPTION OF THE PREFERRED EMBODIMENTS

Description will, hereinafter, be made of the structure of a substrate processing apparatus according to a first embodiment of the present invention with reference to the drawings.

First Embodiment

Figure 1:
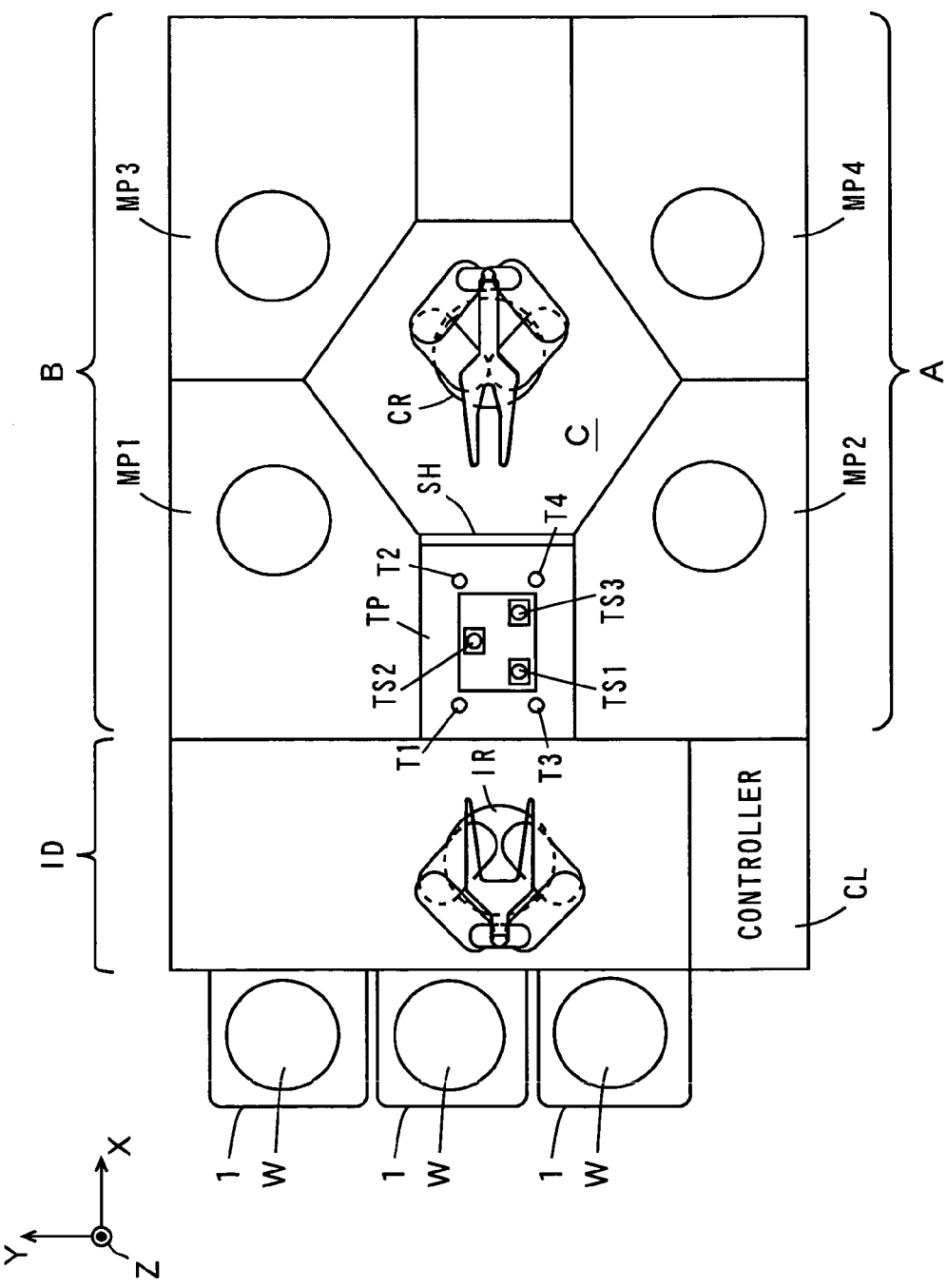
FIG. 1 is a plan view of a substrate processing apparatus according to a first embodiment of the present invention.

FIG. 1 is a plan view of the substrate processing apparatus 100 according to the first embodiment of the present invention. Note that each of the figures from FIG. 1 is provided with the XYZ rectangular coordinates system for clarity of positional relationships. In each axis, the direction toward the arrow is defined as + direction, and the opposite direction thereto is defined as − direction. Further, as for the X axis in each of FIGS. 1-3, 8, and 10, the vertical and forward direction to the paper is defined as +Z direction, and the vertical and backward direction to the paper is defined as −Z direction. As for the Y axis in FIG. 4, the vertical and forward direction to the paper is defined as −Y direction, and the vertical and backward direction to the paper is defined as +Y direction.

The substrate processing apparatus 100 as shown in FIG. 1 includes single-substrate processing cleaning units MP1, MP2, MP3, MP4 (hereinafter abbreviated to MP1 to MP4) for cleaning substrates W; an indexer robot IR and a substrate transport robot CR as substrate transporting apparatuses; cassettes 1; and a controller CL.

As shown in FIG. 1, the substrate processing apparatus 100 has processing regions A, B, and a transport region C between the processing regions A and B.

The cleaning units MP2, MP4 are arranged in the processing region A. The cleaning units MP1, MP3 are arranged in the processing region B.

In the transport region C, the substrate transport robot CR is rotatably provided. Further, a transfer portion TP is provided between the transport region C and indexer ID, where the substrates W are transferred between the indexer robot IR and the substrate transport robot CR. The transfer portion TP is provided with a plurality of ultrasonic distance measuring sensors (ultrasonic length measuring sensors) as mentioned later, and a plurality of standing positioning pins T1, T2, T3, T4.

While moving in the ±Y direction, the indexer robot IR provided in the indexer ID takes out a substrate W from a cassette 1, and reversely receives a substrate W which has undergone a series of processings from the substrate transport robot CR to return it to a cassette 1.

The substrate transport robot CR transports the substrate W transferred from the indexer robot IR to a designated one of the cleaning units MP1 to MP4 or transports the substrate W received from one of the cleaning units MP1 to MP4 to another of the cleaning units MP1 to MP4 or to the indexer robot IR.

The controller CL is composed of a computer including a CPU (Central Processing Unit) or the like, and controls the operations of each of the cleaning units MP1 to MP4 in the transport regions A, B, the substrate transport robot CR in the transport region C, and the indexer robot IR in the indexer ID.

Figure 2:
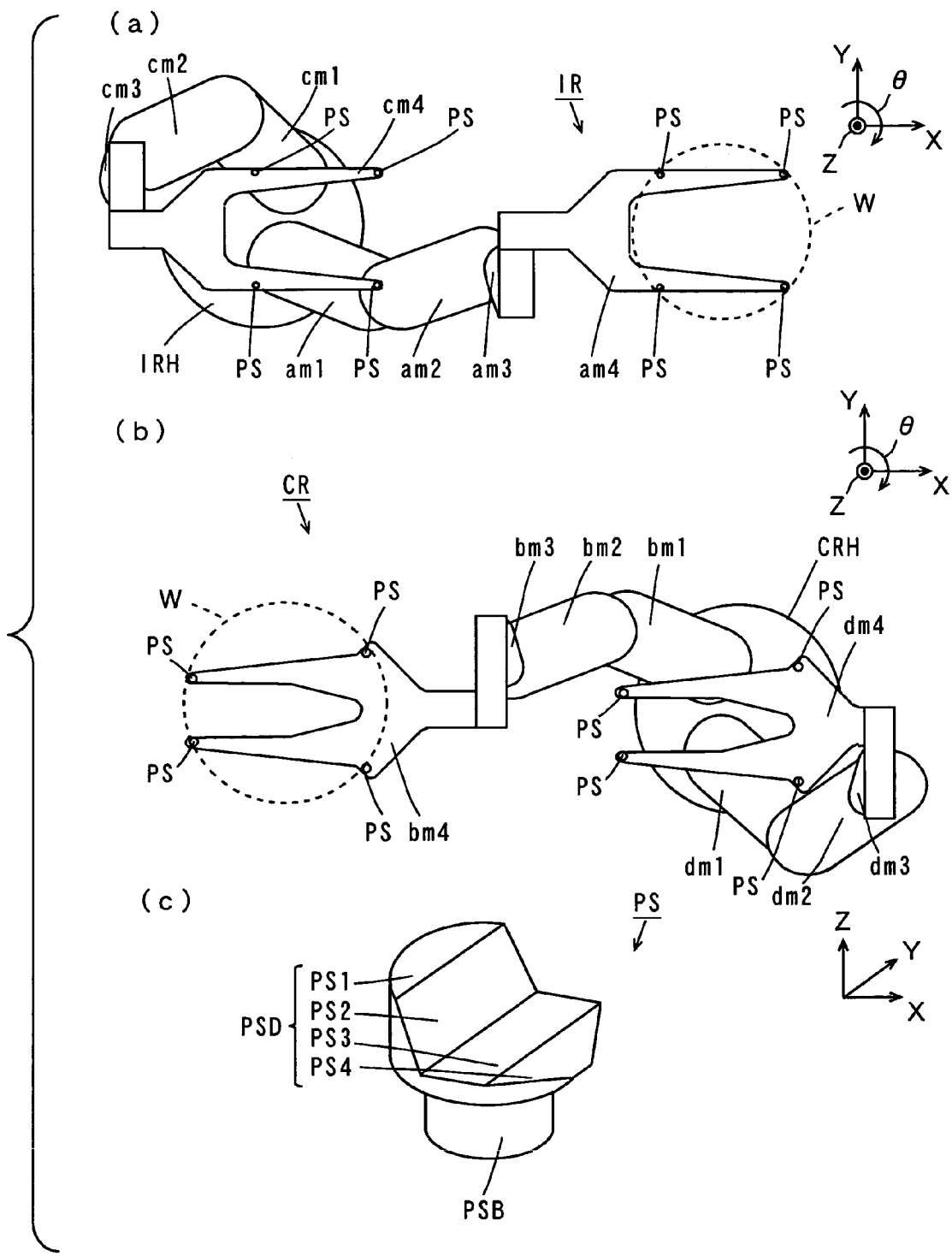
FIG. 2 is a plan view showing the structures of the indexer robot and the substrate transport robot in the substrate processing apparatus as shown in FIG. 1.

FIG. 2 is a plan view showing the structures of the indexer robot IR and the substrate transport robot CR in the substrate processing apparatus 100 as shown in FIG. 1. FIG. 2(a) shows the multiple-joint arm structure of the indexer robot IR; FIG. 2(b) shows the multiple-joint arm structure of the substrate transport robot CR; and FIG. 2(c) shows the structure of a substrate supporter PS. Note that as for the θ in FIG. 2(a) and (b), the clockwise direction on the paper is defined as +θ direction, whereas the counterclockwise direction on the paper is defined as −θ direction.

As shown in FIG. 2(a), the indexer robot IR comprises a pair of transport arms am4, cm4 for holding the substrate W; advance/withdrawing members am1, am2, am3, and cm1, cm2, cm3 for allowing the pair of transport arms, am4, cm4 to advance/withdraw relative to a main body IRH of the indexer robot independently from one other; a rotating mechanism (not shown) for rotating the main body IRH of the indexer robot in the ±θ direction around the vertical axis; a lifting mechanism (not shown) for lifting the main body IRH of the indexer robot in the ±Z direction; and a ±Y direction movement mechanism (not shown) for moving the main body IRH of the indexer robot in the ±Y direction.

The advance/withdrawing members, am1, am2, am3, and cm1, cm2, cm3 are of multiple-joint arm type which allow the pair of transport arms, am4, cm4 to advance/withdraw in the horizontal direction while maintaining their attitudes. One transport arm am4 is designed to advance/withdraw on an upper side than the other transport arm cm4, and these transport arms am4, cm4 vertically overlap with each other in an initial state with both the pair of transport arms am4, cm4 being withdrawn above the main body IRH of the indexer robot.

The main body IRH of the indexer robot drives the advance/withdrawing members am1, am2, am3, and cm1, cm2, cm3 in accordance with an instruction from the above-mentioned controller CL. The advance/withdrawing members am1, am2, am3, and cm1, cm2, cm3 have a drive device composed of motors, wires, pulleys, and the like for reciprocation of the pair of transport arms am4, cm4. A drive force is directly applied to each of the pair of transport arms am4, cm4, thereby allowing it to reciprocate in the ±X direction.

This allows the transport arms am4, cm4 of the indexer robot IR to move in the ±Z direction, rotate in the ±θ direction, and extend/contract while supporting the substrate W.

Further, a plurality of substrate supporters PS as described later are attached to the top surface of each of the transport arms am4, cm4. In the embodiment, four substrate supporters PS are attached at equal spacings along the periphery of the substrate W which is placed on the top surface of each of the transport arms am4, cm4. The substrate W is supported by the four substrate supporters PS.

Note that the number of substrate supporters is not limited to four, and the substrate supporters may be used in any number with which the substrate W can be stably supported.

As shown in FIG. 2(b), the substrate transport robot CR comprises a pair of transport arms bm4, dm4 for holding the substrate W; advance/withdrawing members, bm1, bm2, bm3, and dm1, dm2, dm3 for allowing the pair of transport arms bm4, dm4 to advance/withdraw relative to a main body CRH of the substrate transport robot independently from one other; a rotating mechanism (not shown) for rotating the main body CRH of the substrate transport robot in the ±θ direction around the vertical axis; and a lifting mechanism (not shown) for lifting the main body CRH of the substrate transport robot in the ±Z direction.

The advance/withdrawing members, bm1, bm2, bm3, and dm1, dm2, dm3 are of multiple-joint arm type which allow the pair of transport arms bm4, dm4 to advance/withdraw in the horizontal direction while maintaining their attitudes. One transport arm, bm4 is designed to advance/withdraw on an upper side than the other transport arm dm4, and these transport arms bm4, dm4 vertically overlap with each other in an initial state with both the pair of transport arms bm4, dm4 being withdrawn above the main body CRH of the substrate transport robot.

The main body CRH of the substrate transport robot drives the advance/withdrawing members bm1, bm2, bm3, and dm1, dm2, dm3 in accordance with an instruction from the above-mentioned controller CL. The advance/withdrawing members bm1, bm2, bm3, and dm1, dm2, dm3 have a drive device composed of motors, wires, pulleys, and the like for reciprocation of the pair of transport arms bm4, dm4. A drive force is directly applied to each of the pair of transport arms bm4, dm4, thereby allowing it to reciprocate in the ±X direction.

This allows the transport arms bm4, dm4 of the substrate transport robot CR to move in the ±Z direction, rotate in the ±θ direction, and extend/contract while supporting the substrate W.

Further, a plurality of substrate supporters PS as described later, are attached to the top surface of each of the transport arms bm4, dm4. In the embodiment, four substrate supporters PS are attached at equal spacings along the periphery of the substrate W which is placed on the top surface of each of the transport arms bm4, dm4. The substrate W is supported by the four substrate supporters PS.

Note that the number of substrate supporters is not limited to four, and the substrate supporters may be used in any number with which the substrate W can be stably supported.

According to the embodiment, since the indexer robot IR and the substrate transport robot CR are each of double-arm type having the respective pairs of transport arms am4, cm4 and bm4, dm4, respective ones of transport arms am4, bm4 each transport a processed substrate W, while the other ones of transport arms cm4, dm4 each transport a substrate W yet to be processed. This prevents particles adhered to the unprocessed substrate W from being transferred to the processed substrate W. Moreover, since each of the transport arms am4, bm4 holds the processed substrate W on the upper side, particles falling from the unprocessed substrate are prevented from re-adhering to the processed substrate W.

Note that in the above embodiment, description has been made of a case where both the indexer robot IR and substrate transport robot CR are of double-arm type having the respective pairs of transport arms am4, cm4 and bm4, dm4; however, either or both of the indexer robot IR and substrate transport robot CR may be of single-arm type with only one transport arm.

Of the respective pairs of transport arms am4, cm4 and bm4, dm4, description will, hereinafter, be provided of one of the transport arms am4 of the indexer robot IR and one of the transport arms bm4 of the substrate transport robot CR with reference to the drawings.

As shown in FIG. 2(c), the substrate supporter PS is composed of a substrate transport base PSD having planes PS1, PS2, PS3, PS4, and a substrate supporting rod PSB.

The planes PS1, PS3 of the substrate transport base PSD are formed in parallel with the horizontal planes XY, while the planes PS2, PS4 are formed to incline a predetermined angle from the XY planes. Note that the plane PS2 is steeper than the plane PS4. Where the horizontal plane PS3 is formed in a sufficiently wide area on the side of the plane PS4, it is not in particular necessary to provide the inclined plane PS4.

A plurality of substrate supporters PS are arranged on each of the top surfaces of am4, bm4 so that the planes PS2, PS4 are directed to the center of the substrate W to form a tapered shape. When the substrate W is in its normal supported state, the bottom surface thereof is being supported by the planes PS3 of the plurality of substrate supporters PS.

Where the periphery of one side of the substrate W is supported by the plane PS2 of one substrate supporter PS, and the periphery of another side of the substrate W is supported by the plane PS3 or PS4 of another substrate supporter PS, the periphery of the substrate W can be easily moved onto the plane PS3 because of this tapered shape of the plane PS2.

Description will, subsequently, be made of the operations of the indexer robot IR and substrate transport robot CR.

Figure 3:
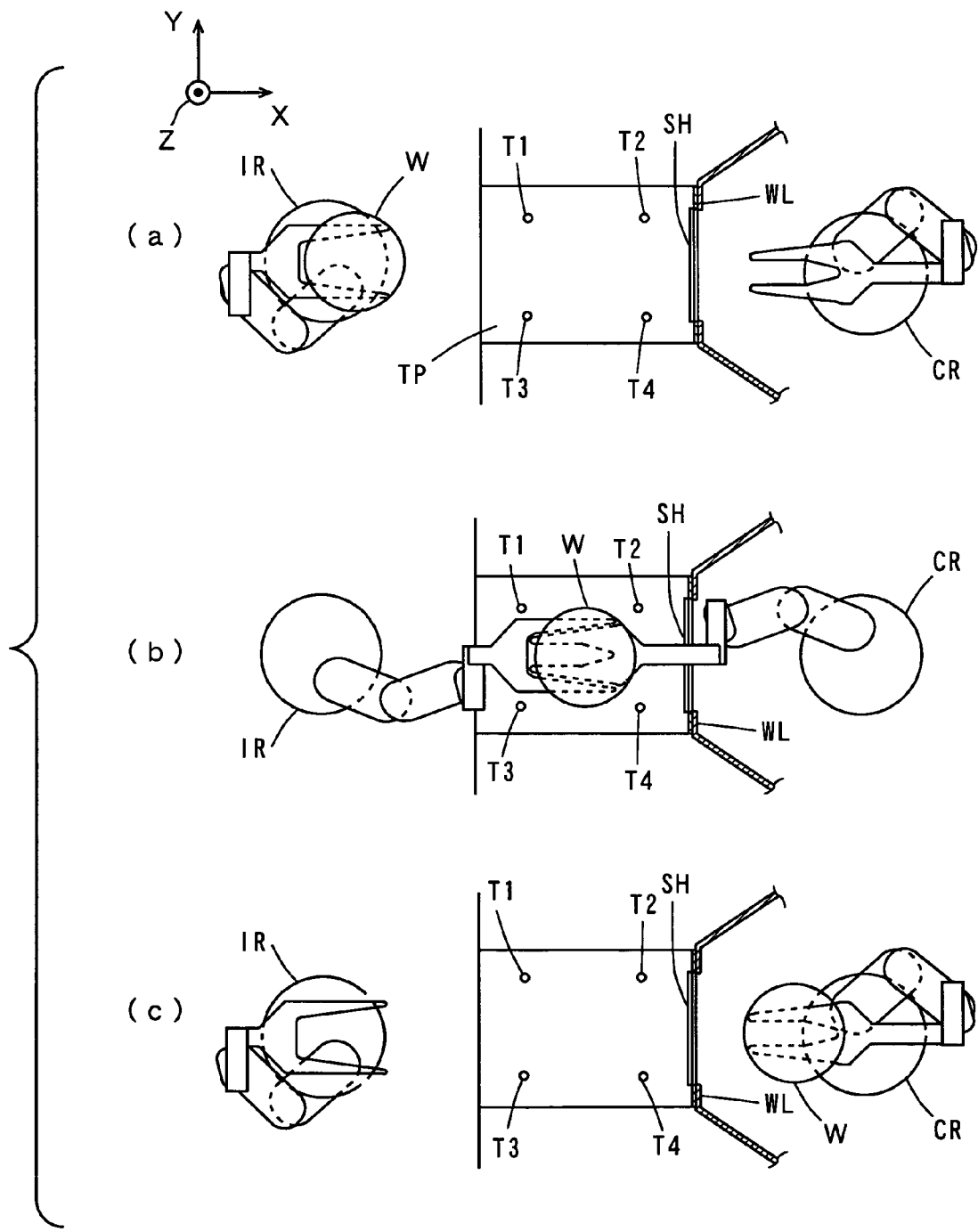
FIG. 3 is a plan view for use in illustrating the transfer of a substrate between the indexer robot and the substrate transport robot in a transfer portion.
Figure 4:
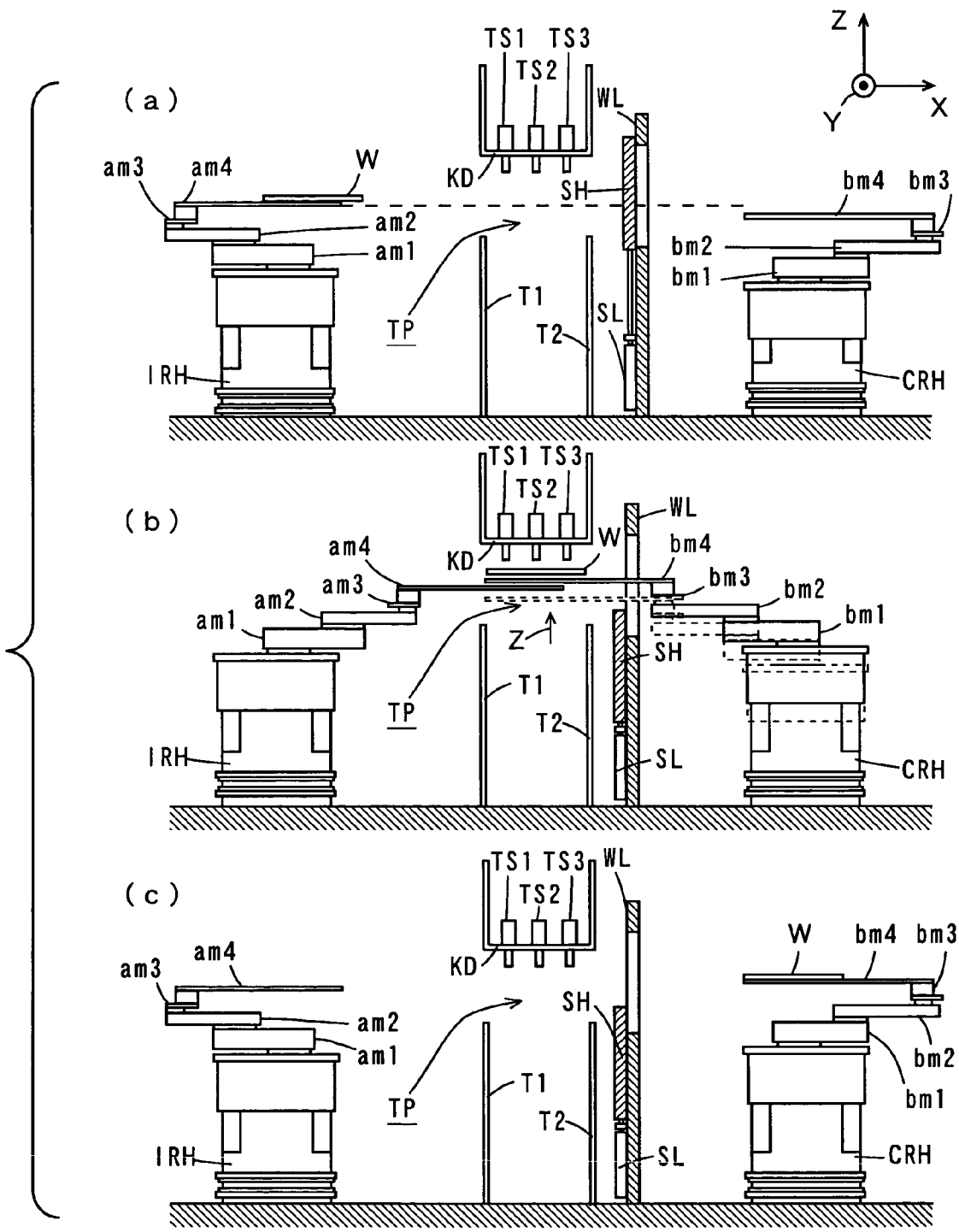
FIG. 4 is a side view for use in illustrating the transfer of the substrate between the indexer robot IR and the substrate transport robot CR in the transfer portion.

FIG. 3 is a plan view for use in illustrating the transfer of the substrate W between the indexer robot IR and the substrate transport robot CR in the transfer portion TP; FIG. 4 is a side view for use in illustrating the transfer of the substrate W between the indexer robot IR and the substrate transport robot CR in the transfer portion TP.

FIG. 3(a) and FIG. 4(a) each show the substrate W being supported by the indexer robot IR; FIG. 3(b) and FIG. 4(b) each show the substrate W which has just been transferred to the substrate transport robot CR from the indexer robot IR; and FIG. 3(c) and FIG. 4(c) each show the substrate W being held by the substrate transport robot CR. Note that the ultrasonic distance measuring sensors TS1, TS2, TS3, the fixing base KD, and the positioning pins T1, T2, T3, T4 as shown in FIG. 4, will later be described.

As shown in FIG. 3(a) and FIG. 4(a), the indexer robot IR initially supports the substrate W with the substrate supporters PS of the transport arm am4.

As shown in FIG. 4(a), a peripheral wall WL with an opening is formed between the indexer robot IR and the transfer portion TP. The opening of the peripheral wall WL is provided with a shutter SH which can freely be opened/closed. The shutter SH is opened/closed by a cylinder SL based on an instruction from the controller CL.

As shown in FIG. 4(a), the transport arm bm4 of the substrate transport robot CR before receiving the substrate W is positioned in a relatively lower direction than the transport arm am4 of the indexer robot IR.

As shown in FIG. 4(b), the controller CL opens the shutter SH by the cylinder SL. The indexer robot IR subsequently advances the transport arm am4 supporting the substrate W to the transfer portion TP. The substrate transport robot CR allows the transport arm bm4 to proceed through the opening of the peripheral wall WL to the transfer portion TP, as indicated by the dot line.

The substrate transport robot CR then upwardly moves the transport arm bm4. This allows the substrate W supported by the transport arm am4 of the indexer robot IR to be supported by the transport arm bm4 of the substrate transport robot CR. At this moment, as shown in the plan view of FIG. 3(b), the transport arm am4 of the indexer robot IR and the transport arm bm4 of the substrate transport robot CR are situated in such plane positions as to avoid the interference with each other's shapes, so that the transport arm bm4 and the transport arm am4 do not interfere with each other when one is lifted relative to the other.

In this case, the substrate W is supported by the four substrate supporters PS provided on the top surface of the transport arm bm4. The transport arm am4 of the indexer robot IR withdraws from the transfer portion TP.

The ultrasonic distance measuring sensors TS1, TS2, TS3, and the controller CL subsequently detect the attitude of the substrate W supported by the transport arm bm4 of the substrate transport robot CR. The controller CL gives the substrate transport robot CR an instruction for the operation in accordance with the detection result of the attitude of the substrate W from the ultrasonic distance measuring sensors TS1, TS2, TS3. The substrate transport robot CR corrects the attitude of the substrate W based on the instruction of the controller CL using the positioning pins T1 to T4. Description will later be made of methods for detecting the attitude of substrate W by the ultrasonic distance measuring sensors TS1, TS2, TS3, and for correcting the attitude of substrate W by the positioning pins T1 to T4.

Where it is determined that the detection result of the attitude of the substrate W is satisfactory, the substrate transport robot CR subsequently withdraws the transport arm bm4 supporting the substrate W from the transfer portion TP, as shown in FIG. 3(c) and FIG. 4(c). After that, the controller CL closes the shutter SH by the cylinder SL.

Description will now be made of detection of the attitude of the substrate W by the ultrasonic distance measuring sensors TS1, TS2, TS3, and correction of the attitude of the substrate W by the positioning pins T1 to T4.

Figure 5:
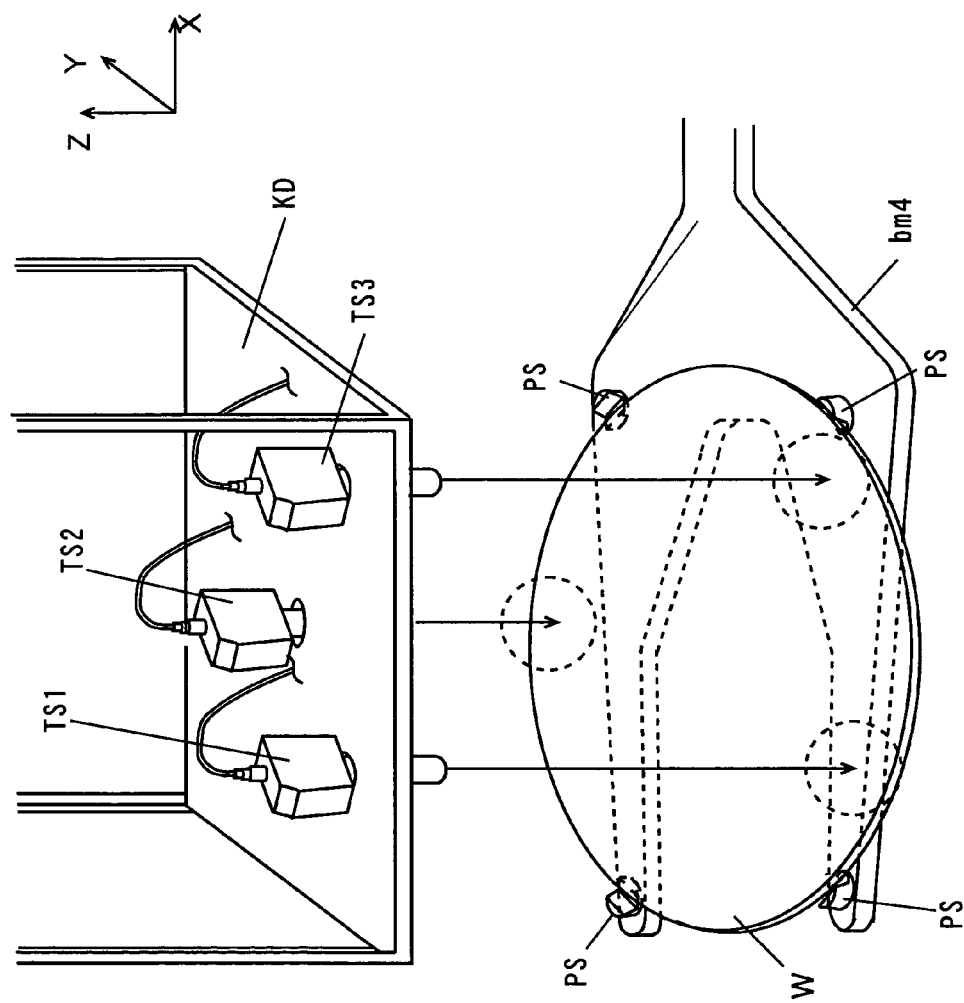
FIG. 5 is a perspective view showing a method for detecting the attitude of the substrate using ultrasonic distance measuring sensors.
Figure 6:
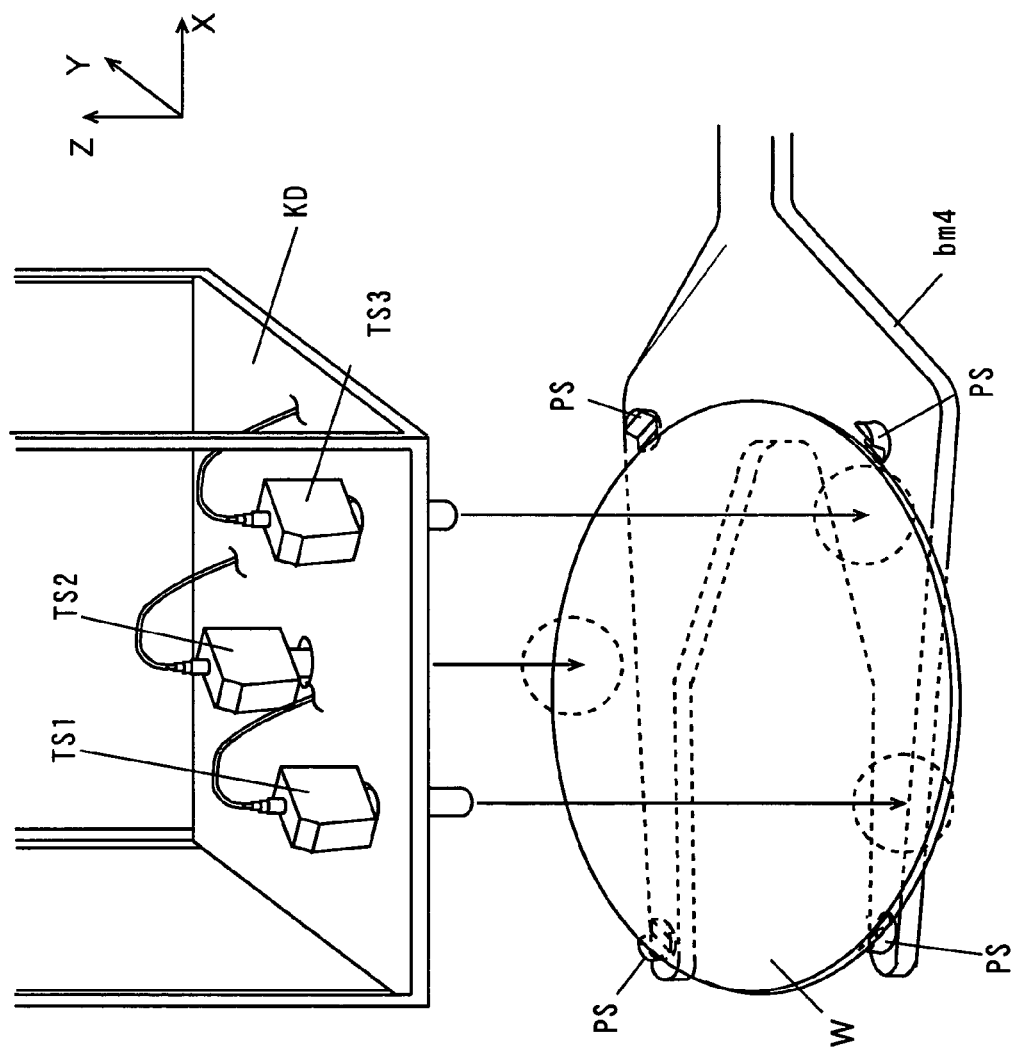
FIG. 6 is a perspective view showing a method for detecting the attitude of the substrate using ultrasonic distance measuring sensors.

FIG. 5 or 6 is a perspective view showing a method for detecting the attitude of the substrate W using the ultrasonic distance measuring sensors TS1, TS2, TS3. FIG. 5 shows the substrate W being normally supported by the transport arm bm4; and FIG. 6 shows the substrate W being supported in an inclined attitude by the transport arm bm4.

Here, an ultrasonic distance measuring sensor transmits ultrasonic to an object, and receives the ultrasonic reflected on the object, thereby measuring the time required for the ultrasonic to be transmitted and received for the measurements of the distance to the object. Using such an ultrasonic distance measuring sensor, the distance to an object made of opaque material as well as transparent material can be accurately measured. Accordingly, unlike an optical length measuring sensor, the ultrasonic distance measuring sensor is capable of accurately measuring the distance to the top surface of the substrate W whether or not the substrate is transparent.

In FIG. 5, the substrate W is normally supported by the planes PS3 of four substrate supporters PS arranged on the top surface of the transport arm bm4. In this case, measurement values (D1, D2, D3) of the respective ultrasonic distance measuring sensors TS1, TS2, TS3 are all within a predetermined acceptable range. The controller CL accordingly determines that the substrate W is being normally supported.

Further, the three ultrasonic distance measuring sensors TS1, TS2, TS3 are fixed on a fixing base KD provided above the substrate W. The three ultrasonic distance measuring sensors TS1, TS2, TS3 are arranged to measure the distance to the top surface of the substrate W in the vicinity of its periphery. In this case, the three ultrasonic distance measuring sensors TS1, TS2, TS3 are positioned so that the measurement values D1, D2, D3 of the respective ultrasonic distance measuring sensors TS1, TS2, TS3 may become equal to each other with the substrate W being normally supported.

The ultrasonic distance measuring sensors TS1, TS2, TS3 each measure the distances to the top surface of the substrate W to feed the measurement values D1, D2, D3 to the controller CL.

The controller CL calculates a direction of inclination and an angle of inclination of the substrate W, based on the measurement value D1 of the ultrasonic distance measuring sensor TS1, measurement value D2 of the ultrasonic distance measuring sensor TS2, and the measurement value D3 of the ultrasonic distance measuring sensor TS3.

Figure 7:
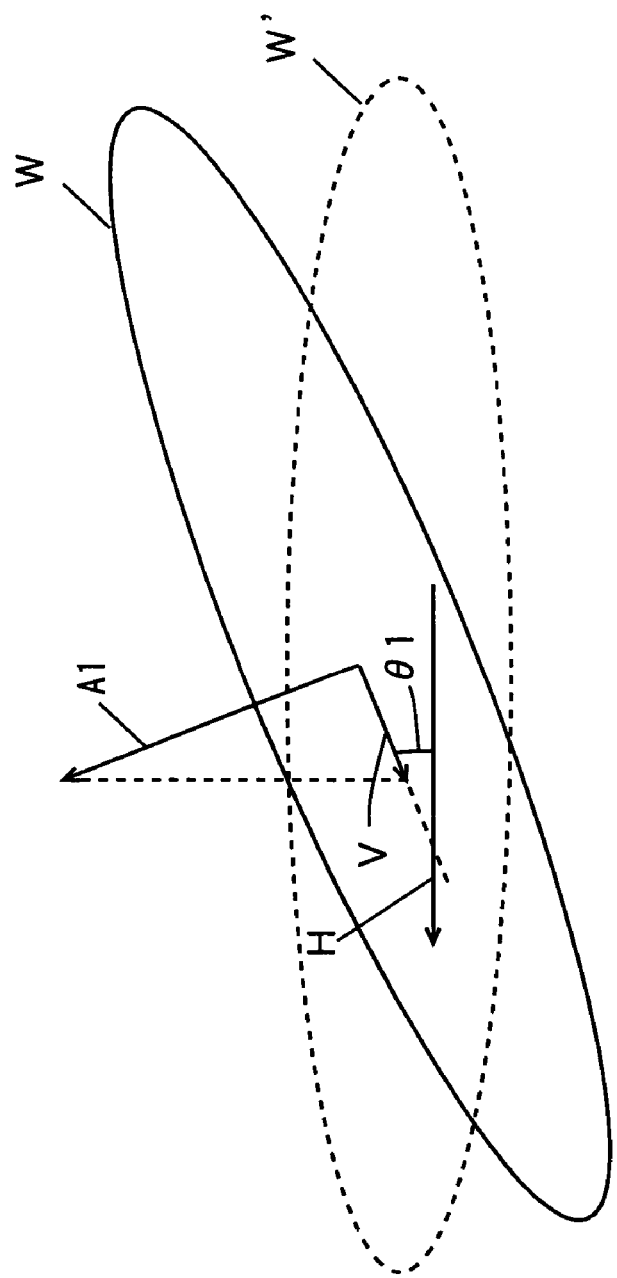
FIG. 7 is a diagram for use in illustrating a method for calculating a direction of inclination and an angle of inclination of the substrate.

Now refer to FIG. 7 which is a diagram for use in illustrating a method for calculating the direction of inclination and angle of inclination of the substrate W.

Initially, an upward normal vector A1 on the surface of the substrate W is projected vertically, downwardly on the surface of the substrate W, which results in an inclined vector V of the substrate W. Then, the inclined vector V is projected onto the XY plane (horizontal plane W'), resulting in a direction H of inclination of the substrate W. The inclined vector V and the XY plane (horizontal plane W') form an angle $\theta 1$ of inclination of the substrate W. The special coordinates of the respective three points on the surface of the substrate W (hereinafter refereed to as measured coordinates. The values of X, Y and Z coordinates correspond to the respective measurement values D1 to D3, the values of X and Y coordinates being known.) which are measured by the ultrasonic distance measuring sensors TS1, TS2, TS3 are then found. Using the three measured coordinates, an equation of the plane including the surface of the substrate W may be derived. The normal vector A1, inclined vector V, direction H of inclination, and angle $\theta 1$ of inclination, are calculated in accordance with the plane equation.

The controller CL subsequently determines if the calculated angle $\theta 1$ of inclination of the substrate W is within a predetermined acceptable range (for example, the angle $\theta 1$ of inclination of the substrate with respect to the horizontal plane being less than one degree). Where the angle $\theta 1$ of inclination is within the predetermined acceptable range, the controller CL determines that the substrate W is normally supported by the transport arm bm4. Where the angle $\theta 1$ of inclination is out of the predetermined acceptable range (not less than one degree, for example), the controller CL determines that the substrate W is supported in an inclined attitude by the transport arm bm4.

Meanwhile, it is noted that as shown in FIG. 5, measurements may be made beforehand of the respective distances (reference values DR1, DR2, DR3) to the top surface of the substrate W which is supported normally (substantially horizontally) by the transport arm bm4, and then actual measurements may be made of the respective distances (measurement values D1, D2, D3) to the top surface of the substrate W, so that differences between the respective reference values and the actual measured distances (distance differences DR1–D1, DR2–D2, DR3–D3) may be calculated to determine an inclined attitude of the substrate W, based on the distance differences DR1–D1, DR2–D2, DR3–D3. This eliminates the need for precisely positioning the ultrasonic distance measuring sensors TS1, TS2, TS3 in upward and downward directions, as in the above embodiment. Consequently, it is possible to determine the attitude of the substrate W with further accuracy, irrespective of the precision in the mounted positions of ultrasonic distance measuring sensors TS1, TS2, TS3.

In FIG. 6, on the other hand, the substrate W is supported by the planes PS1 and the inclined planes PS4 of the four substrate supporters PS arranged on the top surface of the transport arm bm4 (see, FIG. 2(b), (c)). In this case, the calculated angle $\theta 1$ of inclination of the substrate W is set to be out of the predetermined acceptable range.

Description will now be made of the operation of the transport arm bm4 of the substrate transport robot CR when the controller CL determines that the substrate W is being supported in an inclined attitude.

Figure 8:
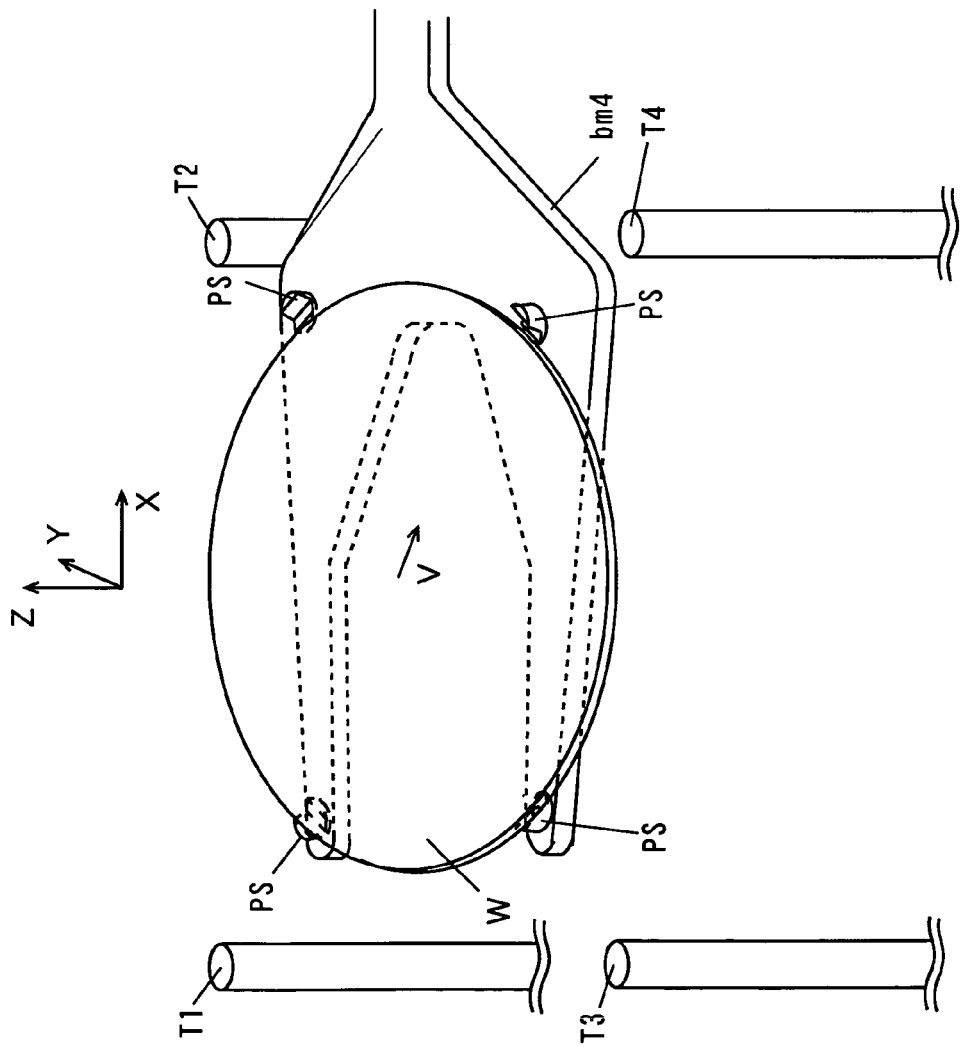
FIG. 8 is a perspective view showing a method for correcting the inclined attitude of the substrate.
Figure 9:
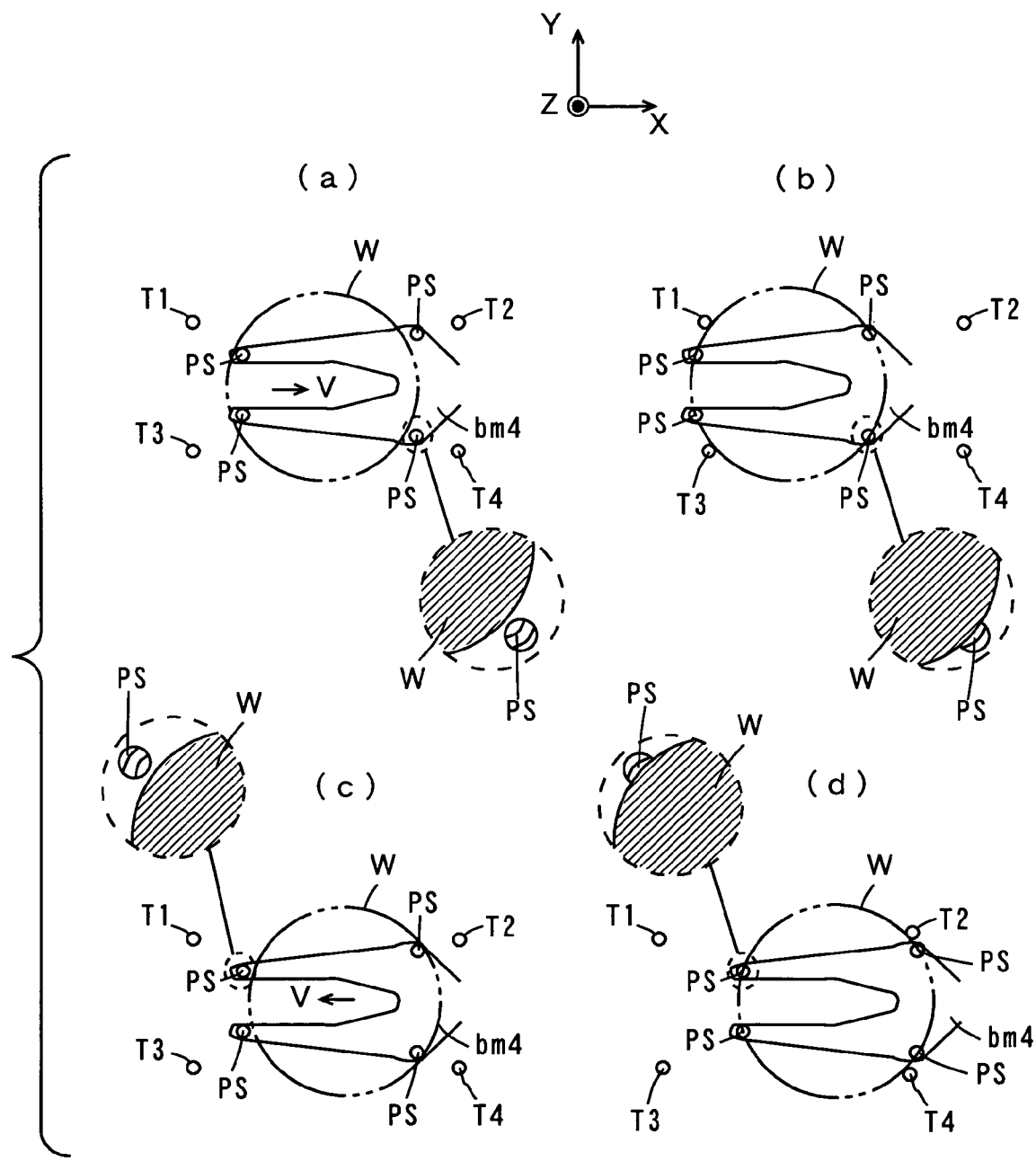
FIG. 9 is a plan view showing a correction process of the inclined attitude of the substrate.

FIG. 8 is a perspective view showing a method for correcting the inclined attitude of the substrate W; and FIG. 9 is a plan view showing a correction process of the inclined attitude of the substrate W.

FIG. 9 shows an example of the substrate W being supported in an inclined attitude; FIG. 9(b) shows an example of correcting the inclined attitude of the substrate W; FIG. 9(c) shows another example of the substrate W being supported in an inclined attitude; and FIG. 9(d) shows another example of correcting the inclined attitude of the substrate W.

Firstly, where the controller CL determines that the substrate W is being supported in an inclined attitude as shown in FIG. 8, the substrate transport robot CR moves in parallel the transport arm bm4 supporting the substrate W to a lower position than the upper ends of the standing positioning pins T1 to T4 provided in the transfer portion TP.

Secondly, in FIG. 9(a), the front side of the periphery of the substrate W (–X direction) is situated on the planes PS1 of two of the substrate supporters PS provided at the tips of the transport arms bm4, whereas the rear side of the periphery of the substrate W (+X direction) is situated on the top surface of the transport arm bm4. In such a case, the controller CL finds the inclined vector V of the substrate W based on the measurement values D1 to D3 which are fed from the ultrasonic distance measuring sensors TS1, TS2, TS3, and further calculates the direction H of inclination (+X direction, in this case), and accordingly determines that the substrate W is inclined with its front side being higher than its rear side while deviated to the front.

In this case, the controller CL instructs the substrate transport robot CR to correct the substrate attitude by causing the front of side of the periphery of the substrate W in an inclined attitude to come into contact with the two positioning pins T1, T3. In other words, the controller CL moves the transport arm bm4 holding the substrate W in the opposite direction (–X direction) to the direction H of inclination of the substrate W (+X direction), thereby bringing the transport arm bm4 closer to the positioning pins T1, T3.

In this case, as shown in FIG. 9(b), the front side of the periphery of the substrate W supported on the tips of the transport arm bm4 abuts the positioning pins T1, T3. This allows the front side of the periphery of the substrate W to move from the planes PS1 of the substrate supporters PS to the planes PS3, while allowing the rear side of the periphery of the substrate W to move from the top surface of the transport arm bm4 via the inclined planes PS4 to the planes PS3. As a result, the substrate W is placed in a horizontal attitude.

In FIG. 9(c), on the other hand, the front side of the periphery of the substrate W (–X direction) is situated on the top surface of the transport arm bm4, whereas the rear side of the periphery of the substrate W (+X direction) is situated on the planes PS1 of two of the supporters PS provided on the rear side of the transport arm bm4. In this case, the controller CL finds the inclined vector V of the substrate W based on the measurement values D1 to D3 which are fed from the ultrasonic distance measuring sensors TS1, TS2, TS3, and further calculates the direction H of inclination (just in the –X direction, in this case), and accordingly determines that the substrate W is inclined with its front side being lower than its rear side while deviated to the back.

In this case, the controller CL instructs the substrate transport robot CR to correct the substrate attitude by causing the rear side of the periphery of the substrate W in an inclined attitude to come into contact with the two positioning pins T2, T4. In other words, the controller CL moves the transport arm bm4 holding the substrate W in the opposite direction (+X direction) to the direction of inclination H of the substrate W (−X direction), thereby bringing the transport arm bm4 closer to the positioning pins T2, T4.

In this case, as shown in FIG. 9(d), the front side of the periphery of the substrate W supported on the tips of the transport arm bm4 abuts the positioning pins T2, T4. This allows the front side of the periphery of the substrate W to move from the top surface of the transport arm bm4 via the planes PS4 of the substrate supporters PS to the planes PS3, while allowing the rear side of the periphery of the substrate W to move from the planes PS1 of the substrate supporters PS to the planes PS3. As a result, the substrate W is placed in a horizontal attitude.

The substrate transport robot CR subsequently lifts up the transport arm bm4 to again determine the attitude of the substrate W using the ultrasonic distance measuring sensors TS1, TS2, TS3. The controller CL calculates the angle θ1 of inclination of the substrate W based on the measurement values D1 to D3 by the ultrasonic distance measuring sensors TS1, TS2, TS3 to determine if the substrate W is in an inclined attitude. Where the controller CL determines that the substrate is in an inclined attitude, it instructs the substrate transport robot CR to repeat the operation as shown in FIGS. 8 and 9.

Meanwhile, where the controller CL determines that the substrate W is not in an inclined attitude, it instructs the substrate transport robot CR to insert the substrate W into each of the cleaning units MP1 to MP4.

As described above, in the substrate processing apparatus 100 according to the embodiment, accurate measurements can be made of the distance to the top surface of the substrate W, using the ultrasonic distance measuring sensors TS1, TS2 TS3. Further, the controller CL is capable of measuring accurately and easily the inclined attitude of the substrate W based on the measurement values D1 to D3 fed from the ultrasonic distance measuring sensors TS1, TS2, TS3.

Moreover, the controller CL in the substrate processing apparatus 100 determines if the substrate W is being held properly, based on the angle θ1 of inclination of the substrate W, and where the substrate W is being held improperly, the controller CL allows the substrate W in an inclined attitude to abut the positioning pins T1 to T4 in an optimum manner, based on the direction H of inclination of the substrate W so as to easily correct the inclined attitude of the substrate W. This prevents dropping of or damage to the substrate W while preventing part of the substrate W from being left unprocessed. As a result, an increase in the cost can be suppressed.

Figure 10:
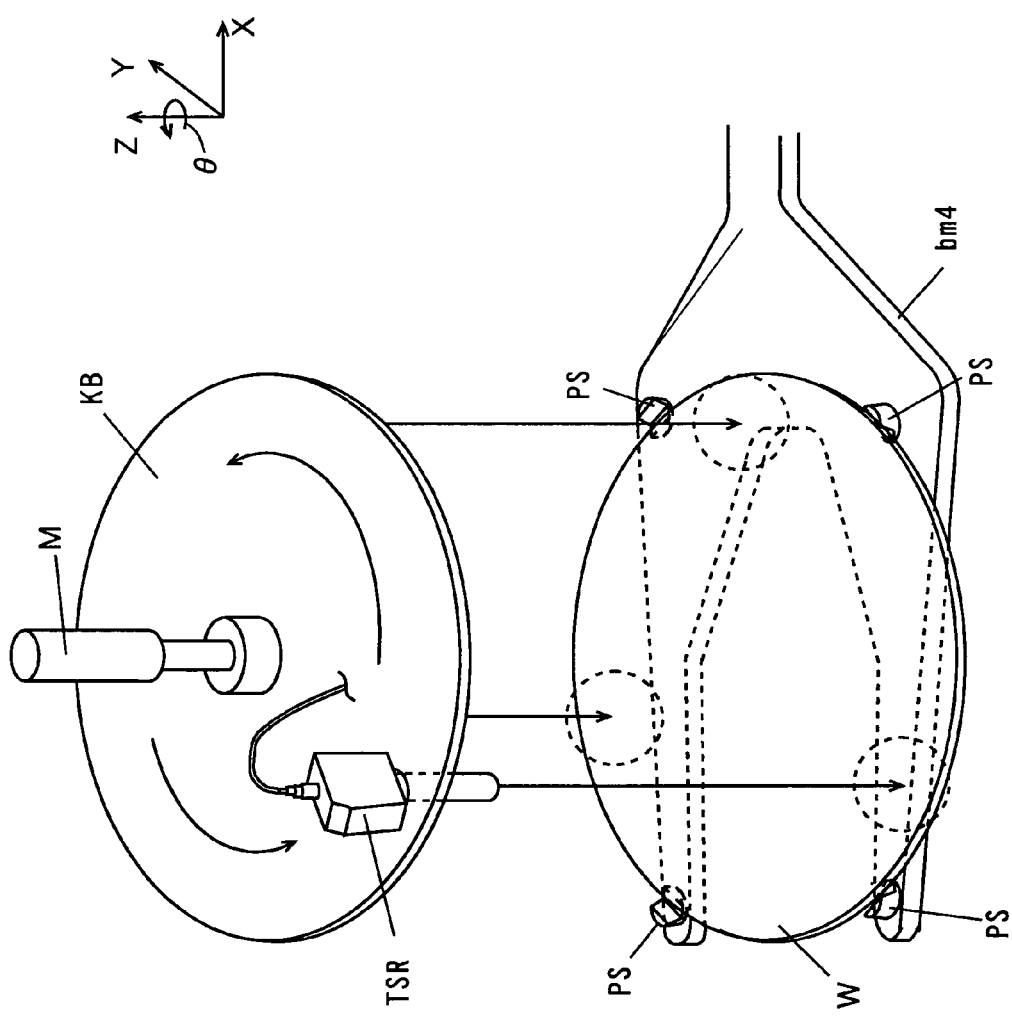
FIG. 10 is a perspective view showing another method for detecting the attitude of the substrate by an ultrasonic distance measuring sensor.

FIG. 10 is a perspective view showing another method for detecting the attitude of the substrate W by an ultrasonic distance measuring sensor TSR.

As shown in FIG. 10, a motor M is fixed above the transfer portion TP with a fixed rotary plate KB mounted around the rotation axis of the motor M. An ultrasonic distance measuring sensor TSR is mounted in the vicinity of the periphery of fixed rotary plate. As the rotation axis of the motor M rotates in the ±θ direction (rotating direction around the vertical axis Z), the fixed rotary plate KB also rotates so that the ultrasonic distance measuring sensor TSR mounted in the fixed rotary plate KB rotates above the periphery of substrate W.

In this case, the controller CL instructs the ultrasonic distance measuring sensor TSR rotating above the periphery of the substrate W to measure distances to three or more points on the top surface of the substrate W in the vicinity of its periphery at predetermined timings (for example, each time the ultrasonic distance measuring sensor TSR rotates 30 degrees in the direction of +θ direction). The ultrasonic distance measuring sensor TSR measures the distances to three or more points on the top surface of the substrate W in accordance with an instruction from the controller CL.

Further, the controller CL is capable of measuring the distances to a plurality of arbitrary positions on the substrate W around its periphery. As a result, the controller CL can accurately determine the direction H of inclination and the angle θ1 of inclination. Consequently, the controller CL is capable of determining if the substrate W is in an appropriate attitude or of correcting the substrate W for inclined attitude, using the positioning pins T1 to T4.

In this case, the need for arrangement of a plurality of ultrasonic distance measuring sensors is eliminated, leading to reduced number of components and assembly steps, as well as reducing the cost in total.

In the embodiment, the ultrasonic distance measuring sensors TS1, TS2, TS3 correspond to detectors; the transport arm bm4 and the substrate supporter PS correspond to supporting devices; the substrate transport robot CR corresponds to a moving device; the positioning pins T1, T2, 3, T4 correspond to a correction mechanism; the controller CL corresponds to a controller and a determiner; and the cleaning units correspond to processing units.

Second Embodiment

Figure 11:
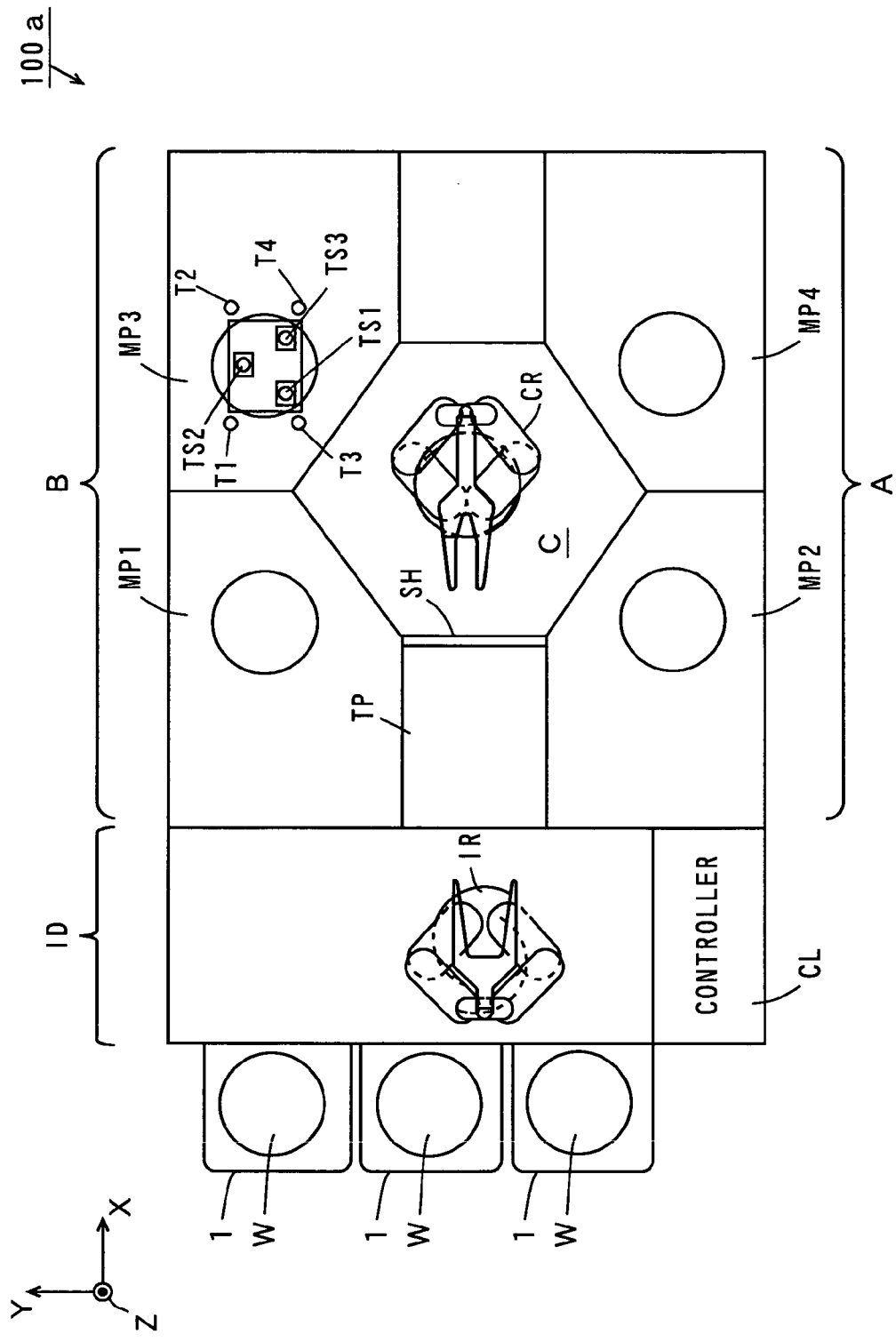
FIG. 11 is a plan view of a substrate processing apparatus according a second embodiment.

FIG. 11 is a plan view of the substrate processing apparatus 100a according the second embodiment. The structure of the substrate processing apparatus 100a as shown in FIG. 11 differs from that of the substrate processing apparatus 100 as shown in FIG. 1 as follows.

The substrate processing apparatus 100a as shown in FIG. 11 comprises ultrasonic distance measuring sensors TS1, TS2, TS3 and positioning pins T1 to T4 in the cleaning unit MP3 instead of the ultrasonic distance measuring sensors TS1, TS2, TS3 and the positioning pins T1 to T4 provided in the transfer portion TP.

In the substrate processing apparatus 100a as shown in FIG. 11, where a substrate W is inserted into the cleaning unit MP3 by the substrate transport robot CR, the distance to the top surface of the substrate W is measured, using the ultrasonic distance measuring sensors TS1, TS2, TS3. The ultrasonic distance measuring sensors TS1, TS2, TS3 each measure the distances to the top surface of the substrate W to feed the measurement values D1, D2, D3 to the controller CL.

The controller CL calculates a direction of inclination and an angle of inclination of the substrate W, based on a measurement value D1 of the ultrasonic distance measuring sensor TS1, a measurement value D2 of the ultrasonic distance measuring sensor TS2, and a measurement value D3 of the ultrasonic measuring sensor TS3.

Here, similarly to the manner shown in FIG. 7, a direction H of inclination and an angle θ1 of inclination of the substrate W are calculated.

The controller CL subsequently determines if the angle θ1 of inclination with respect to the substrate W is in a predetermined acceptable range (for example, the angle θ1 of inclination of the substrate W with respect to the horizontal plane being in less than one degree). Where the angle θ1 of inclination is in the predetermined acceptable range, the controller CL determines that the substrate W is being normally supported in the cleaning processing unit MP3. Where the angle θ1 of inclination is out of the predetermined acceptable range (not less than one degree, for example), the controller CL determines that the substrate W is being supported in an inclined attitude in the cleaning unit MP3.

Here, it is noted that measurements may be made beforehand of the respective distances (reference values DM1, DM2, DM3) to the top surface of the substrate W which is supported normally (substantially horizontally) in the cleaning processing unit MP3 as shown in FIG. 11, and then actual measurements may be made of the respective distances (measurement values D1, D2, D3) to the top surface of the substrate W, so that differences between the respective reference values and the actual measured distances (distance differences DM 1–D1, DM 2–D2, DM 3–D3) may be calculated, so as to determine an inclined attitude of the substrate W, based on the distance differences DM 1–D1, DM 2–D2, DM 3–D3. This eliminates the need for precisely positioning the ultrasonic distance measuring sensors TS1, TS2, TS3 in upward and downward directions, as in the above embodiment. Consequently, it is possible to determine the attitude of the substrate W with further accuracy, irrespective of the precision in the mounted positions of ultrasonic distance measuring sensors TS1, TS2, TS3.

Where the controller CL determines that the substrate W is being supported in an inclined attitude, the controller CL controls the transport arm bm4 so that the substrate W may abut any one of or a plurality of the positioning pins T1 to T4, in accordance with the direction H of inclination of the substrate W in an inclined attitude as shown in FIGS. 8 and 9, thereby placing the substrate W in a normal attitude.

As described above, in the substrate processing apparatus 10a according to the second embodiment, accurate measurements can be made of the distance to the top surface of the substrate W, using the ultrasonic distance measuring sensors TS1, TS2, TS3 in the cleaning unit MP3. Also, the controller CL can easily determine the inclined attitude of the substrate W based on the measurement values D1, D2, D3 fed from the respective ultrasonic distance measuring sensors TS1, TS2, TS3, prior to cleaning processing by the cleaning units MP.

Further, the controller CL in the substrate processing apparatus 100 can detect the inclined attitude of the substrate W based on its direction H of inclination and angle θ1 of inclination, allowing the substrate W in an inclined attitude to abut the standing positioning pins T1 to T4 provided in the cleaning unit MP3, in an optimum manner based on the direction of inclination H, thereby controlling the substrate transport robot CR to easily correct the substrate W for inclined attitude. This prevents dropping of or damage to the substrate W while preventing part of the substrate W from being left unprocessed. As a result, an increase in the cost can be suppressed.

In the second embodiment, the ultrasonic distance measuring sensors TS1, TS2, TS3 correspond to detectors; the transport arm bm4 and the substrate supporters PS correspond to supporting devices; the substrate transport robot CR corresponds to a moving device; the positioning pins T1, T2, T3, T4 correspond to a correction mechanism or a butting members; the controller CL corresponds to a control device; and the cleaning unit corresponds to a processing unit.

(Another Example of Method for Detecting Attitude of Substrate W)

Figure 12:
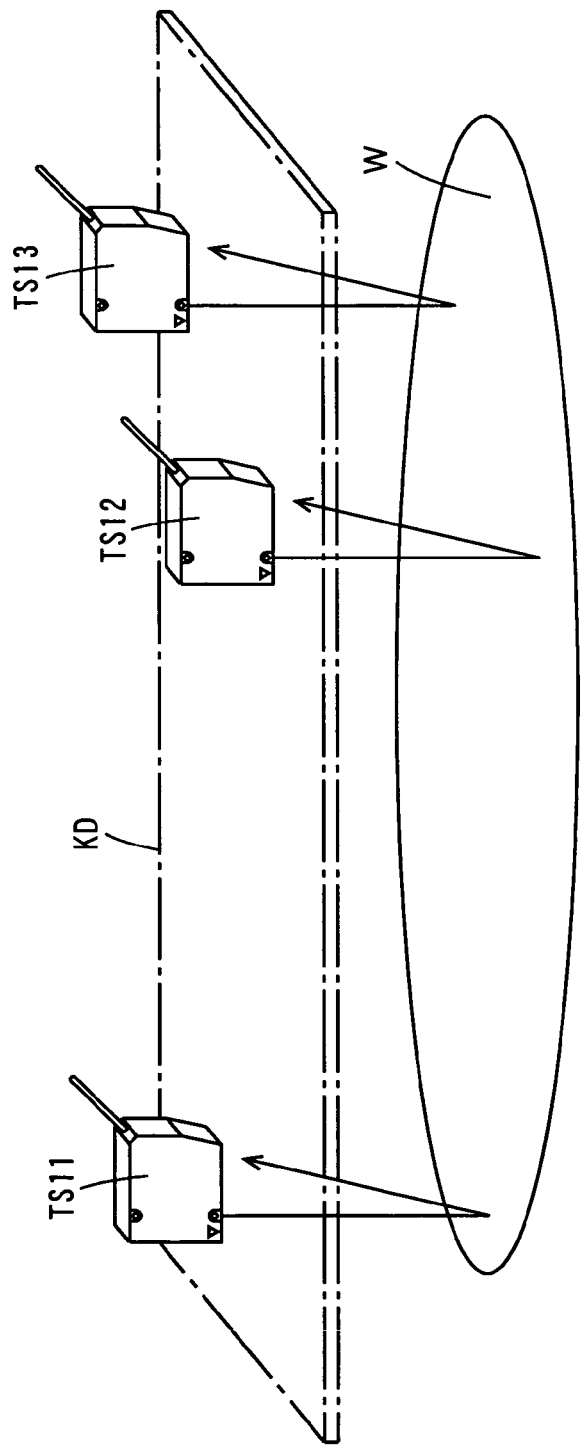
FIG. 12 is a perspective view showing another example of a method for detecting the attitude of the substrate in the substrate processing apparatus as shown in FIG. 1.
Figure 13:
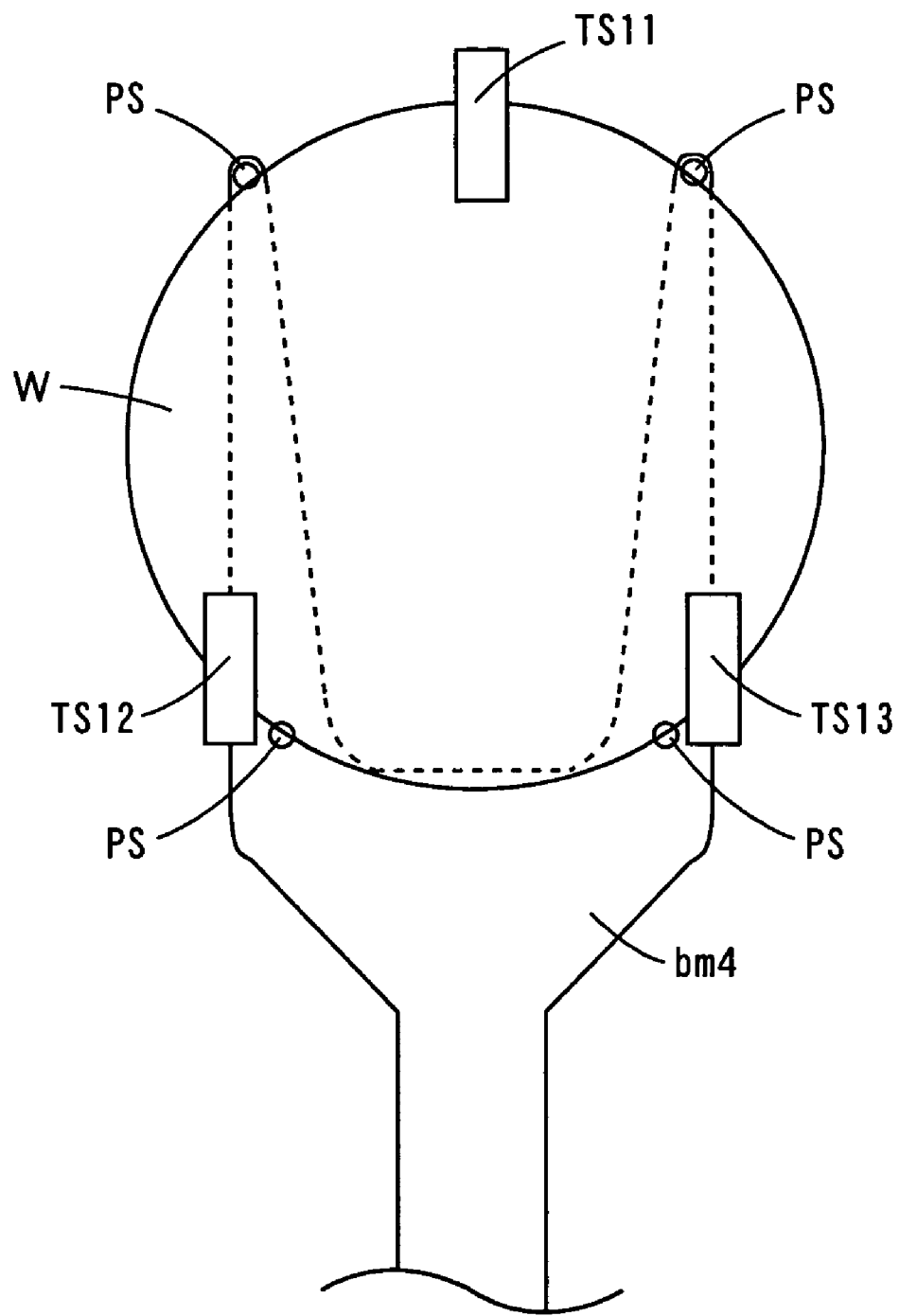
FIG. 13 is a plan view showing another example of a method for detecting the attitude of the substrate.

FIG. 12 is a perspective view showing another example of a method for detecting the attitude of the substrate W in the substrate processing apparatus 100 as shown in FIG. 1; and FIG. 13 is a plan view showing another example of a method for detecting the attitude of the substrate W.

In the examples of FIGS. 12 and 13, laser distance measuring sensors (laser displacement sensors) TS1, TS2, TS3, instead of the ultrasonic distance measuring sensors TS1, TS2, TS3 as shown in FIGS. 5 and 6, are provided. Similarly to the examples of FIGS. 5 and 6, the laser distance measuring sensors TS11, TS12, TS13 are fixed on the fixing base KD provided above the transfer portion TP as shown in FIG. 1. The laser distance measuring sensors TS11, TS12, TS13 are arranged to measure the distance to a top surface of the substrate W in the vicinity of its periphery. In this case, the laser distance measuring sensors TS11, TS12, TS13 are positioned so that measurement values D1, D2, D3 of the respective ultrasonic distance measuring sensors TS11, TS12, TS13 may become equal to each other with the substrate being normally supported.

The laser distance measuring sensors TS11, TS12, TS13 each measure the distances to the top surface of the substrate W to supply the measurement values D1, D2, D3 to the controller CL as shown in FIG. 1.

The controller CL calculates a direction of inclination and an angle of inclination of the substrate W, based on the measurement value D1 of the ultrasonic distance measuring sensor TS11, measurement value D2 of the ultrasonic distance measuring sensor TS12, and the measurement value D3 of the ultrasonic distance measuring sensor TS13.

The method for calculating the direction of inclination and angle of inclination of the substrate W is the same as those explained using FIGS. 5 to 7. Also, the method for correcting the inclined attitude of the substrate W is the same as that explained using FIGS. 8 and 9.

Note that in this example, the laser distance measuring sensors TS11, TS12, TS13 correspond to detectors.

FIG. 14 is a schematic diagram for use in illustrating the structure and operating principle of the laser distance measuring sensor TS11 as shown in FIGS. 12 and 13. The structure and operating principle of each of the laser distance measuring sensors TS12, TS13 are the same as those of the laser distance measuring sensor as shown in FIG. 14.

As shown in FIG. 14, the laser distance measuring sensor TS11 comprises a laser light source 401 and a CCD (charge-coupled device) 402. A laser light emitted from the light source 401 irradiates an object OB. The light reflected from the object OB passes through a light receiving lens 403 to be received on a light-receiving surface of the CCD 402. The laser distance measuring sensor TS11 is capable of measuring the distance to the object OB with a high resolution (0.1 μm, for example), using a triangulation technique.

As indicated by the solid arrow in FIG. 14, where the object OB is positioned near to the laser distance measuring sensor TS11, an angle θ1 formed by an incident light on the object OB and an incident light on the CCD 402 increases. On the other hand, as indicated by the dotted arrow in FIG. 14, where the object OB is positioned far from the laser distance measuring sensor TS11, an angle θ2 formed by an incident light on the object OB and an incident light on the CCD 402 decreases. This changes the position of a light spot formed on the light receiving surface of the CCD 402, depending on the distance from the laser distance measuring sensor TS11 to the object OB. The laser distance measuring sensor TS11 detects the position of the light spot on the light receiving surface of the CCD 402, thereby generating a voltage signal proportional to the distance to the object OB. Accordingly, the distance to the object OB can be measured based on the voltage signal output from the laser distance measuring sensor TS11.

In this example, accurate measurements can be made of the distance to the top surface of the substrate W, using the laser distance measuring sensors TS11, TS12, TS13. Further, the controller CL is capable of accurately and easily determining the inclined attitude of the substrate W, based on the measurement values D1 to D3 supplied from the laser distance measuring sensors TS11, TS12, TS13.

In this case also, the controller CL initially determines if the substrate W is being held properly based on the angle of inclination of the substrate W. Where the substrate W is being held improperly, the controller CL allows the substrate W in an inclined attitude to abut the positioning pins T1 to T4 as shown in FIG. 8 in an optimum manner, thereby easily correcting the substrate W for inclined attitude.

Note that in the example shown in FIG. 10, the laser distance measuring sensor TS11 may be used instead of the ultrasonic distance measuring sensor TSR.

In this case also, measurements can be made of the distances to a plurality of arbitrary positions on the top surface of the substrate W in the vicinity of its periphery, using the laser distance measuring sensor TS11. This allows the controller CL to accurately determine the direction of inclination and the angle of inclination of the substrate W. Consequently, the controller CL is capable of more optimally determining if the substrate W is in an appropriate attitude, and of correcting the substrate W for inclined attitude, using the positioning pins T1 to T4 as shown in FIG. 8.

Further, in the substrate processing apparatus 100a as shown in FIG. 11, the laser distance measuring sensors TS11, TS12, TS13 may be used instead of the ultrasonic distance measuring sensors TS1, TS2, TS3 in the cleaning unit MP3.

In this case also, accurate measurements can be made of the distance to the top surface of the substrate W, using the laser distance measuring sensors TS11, TS12, TS13 in the cleaning unit MP3. This allows the controller CL to easily determine the inclined attitude of the substrate W, prior to cleaning processing by the cleaning units MP. Consequently, the controller CL can easily correct the substrate W for incline attitude, using the positioning pins T1 to T4 in the cleaning unit MP3.

(Still Another Example of Method for Detecting Attitude of Substrate W)

Figure 15:
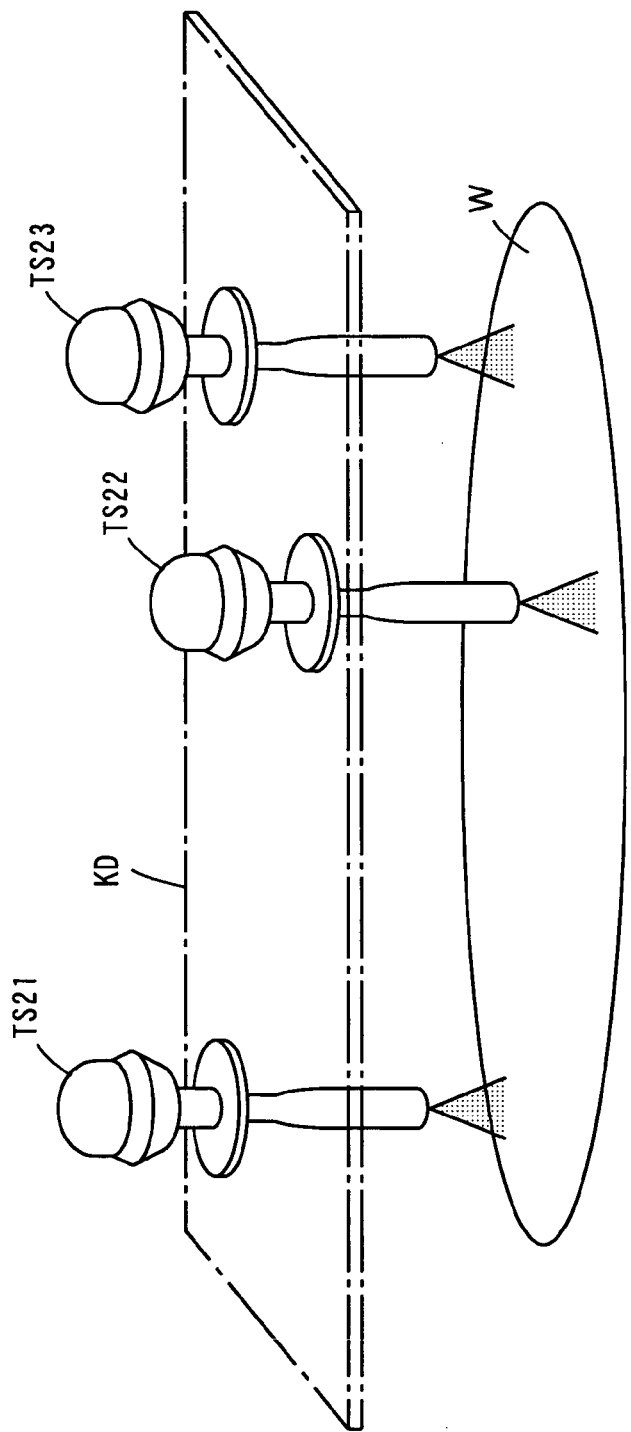
FIG. 15 is a perspective view showing still another example of a method for detecting the attitude of the substrate in the substrate processing apparatus as shown in FIG. 1.

FIG. 15 is a perspective view showing still another example of a method for detecting the attitude of the substrate W in the substrate processing apparatus 100 as shown in FIG. 1; and FIG. 16 is a plan view showing still another example of a method for detecting the attitude of the substrate W.

In the examples of FIGS. 15 and 16, microwave distance measuring sensors (microwave displacement sensors) TS21, TS22, TS23, instead of the ultrasonic distance measuring sensors TS1, TS2, TS3 as shown in FIGS. 5 and 6, are provided. Similarly to the examples of FIGS. 5 and 6, the microwave distance measuring sensors TS21, TS22, TS23 are fixed on the fixing base KD provided above the transfer portion TP. The microwave distance measuring sensors TS21, TS22, TS23 are arranged to measure the distance to a top surface of the substrate W in the vicinity of its periphery. In this case, the microwave distance measuring sensors TS21, TS22, TS23 are positioned so that measurement values D1, D2, D3 of the respective microwave distance measuring sensors TS21, TS22, TS23 may become equal to each other with the substrate being normally supported.

The microwave distance measuring sensors TS21, TS22, TS23 each measure the distances to the top surface of the substrate W to supply the measurement values D1, D2, D3 to the controller CL.

The controller CL calculates a direction of inclination and an angle of inclination of the substrate W, based on the measurement value D1 of the microwave distance measuring sensor TS21, measurement value D2 of the microwave distance measuring sensor TS22, and the measurement value D3 of the microwave distance measuring sensor TS23.

The method for calculating the direction of inclination and angle of inclination of the substrate W is the same as that explained using FIGS. 5 to 7. Also, the method for correcting the inclined attitude of the substrate W is the same as that explained using FIGS. 8 and 9.

Note that in this example, the microwave distance measuring sensors TS21, TS22, TS23 correspond to detectors.

A microwave distance measuring sensor transmits a radiowave in the microwave band such as X band to an object, while receiving the radiowave reflected from the object, thereby measuring the distance to the object based on a time difference between the transmission and reception.

The microwave distance measuring sensor outputs a voltage signal proportional to the distance to the object. Accordingly, measurements can be made of the distance to the object based on the voltage signal output from the microwave distance measuring sensor. Using the microwave distance measuring sensor, accurate measurements can be made of an object made of transparent material as well as opaque material.

In this example, accurate measurements can be made of the distance to the top surface of the substrate W, using the microwave distance measuring sensors TS21, TS22, TS23. Further, the controller CL is capable of accurately and easily determining the inclined attitude of the substrate W, based on the measurement values D1 to D3 supplied from the microwave distance measuring sensors TS21, TS22, TS23.

In this case also, the controller CL initially determines if the substrate W is being held properly based on the angle of inclination of the substrate W. Where the substrate W is being held improperly, the controller CL allows the substrate W in an inclined attitude to abut the positioning pins T1 to T4 as shown in FIG. 8 in an optimum manner, thereby easily correcting the substrate W for inclined attitude.

Note that in the example shown in FIG. 10, the microwave distance measuring sensor TS21 may be used instead of the ultrasonic distance measuring sensor TSR.

In this case also, measurements can be made of the distances to a plurality of arbitrary positions on the top surface of the substrate W in the vicinity of its periphery, using the microwave distance measuring sensor TS21. This allows the controller CL to accurately determine the direction of inclination and the angle of inclination of the substrate W. Consequently, the controller CL is capable of more optimally determining if the substrate W is in an appropriate attitude, and of correcting the substrate W for inclined attitude, using the positioning pins T1 to T4 as shown in FIG. 8.

Further, in the substrate processing apparatus 100a as shown in FIG. 11, the microwave distance measuring sensors TS21, TS22, TS23 may be used instead of the ultrasonic distance measuring sensors TS1, TS2, TS3 in the cleaning unit MP3.

In this case also, accurate measurements can be made of the distance to the top surface of the substrate W, using the microwave distance measuring sensors TS21, TS22, TS23 in the cleaning unit MP3. This allows the controller CL to easily determine the inclined attitude of the substrate W, prior to cleaning processing by the cleaning units MP. Consequently, the controller CL can easily correct the substrate W for incline attitude, using the positioning pins T1 to T4 in the cleaning unit MP3.

Third Embodiment

Figure 17:
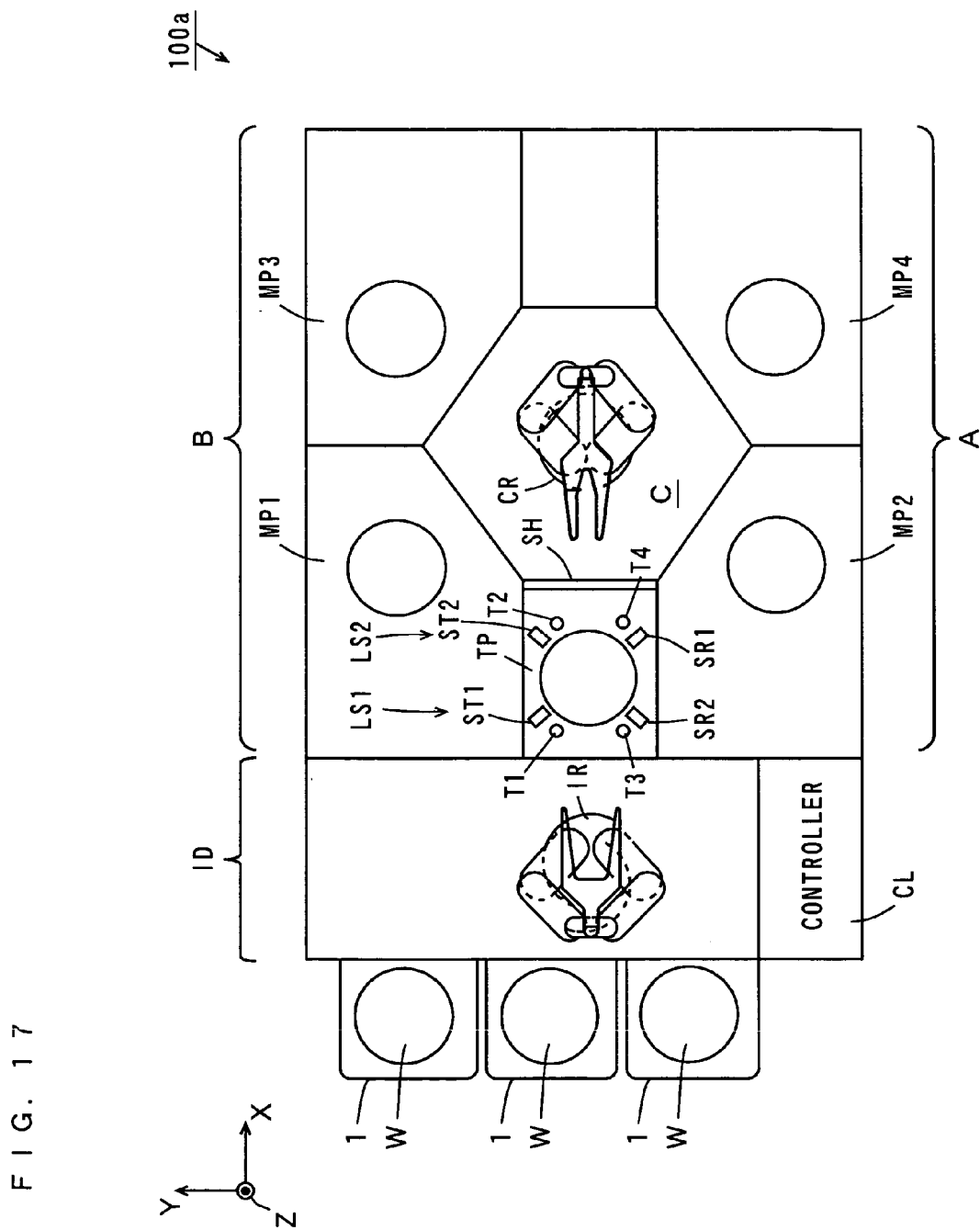
FIG. 17 is a plan view showing a substrate processing apparatus according to a third embodiment.

FIG. 17 is a plan view showing the substrate processing apparatus 100a according to the third embodiment. The structure of the substrate processing apparatus 100a as shown in FIG. 17 differs from that of the substrate processing apparatus 100 as shown in FIG. 1 as follows.

The substrate processing apparatus 100a as shown in FIG. 17 comprises two optical length measuring sensors LS1, LS2, instead of the ultrasonic distance measuring sensors TS1, TS2, TS3 and the fixing base KD.

According to the third embodiment, the attitude of a substrate W is detected using the two optical length measuring sensors LS1, LS2, instead of the ultrasonic distance measuring sensors TS1, TS2, TS3 according to the first embodiment. Note that the optical length measuring sensor LS1 comprises a light emitter ST1 and a light receiver SR1, and the optical length measuring sensor LS2 comprises a light emitter ST 2 and a light receiver SR2. Description will now be made of a method for detecting the attitude of the substrate W by the optical length measuring sensors LS1, LS2.

Figure 18:
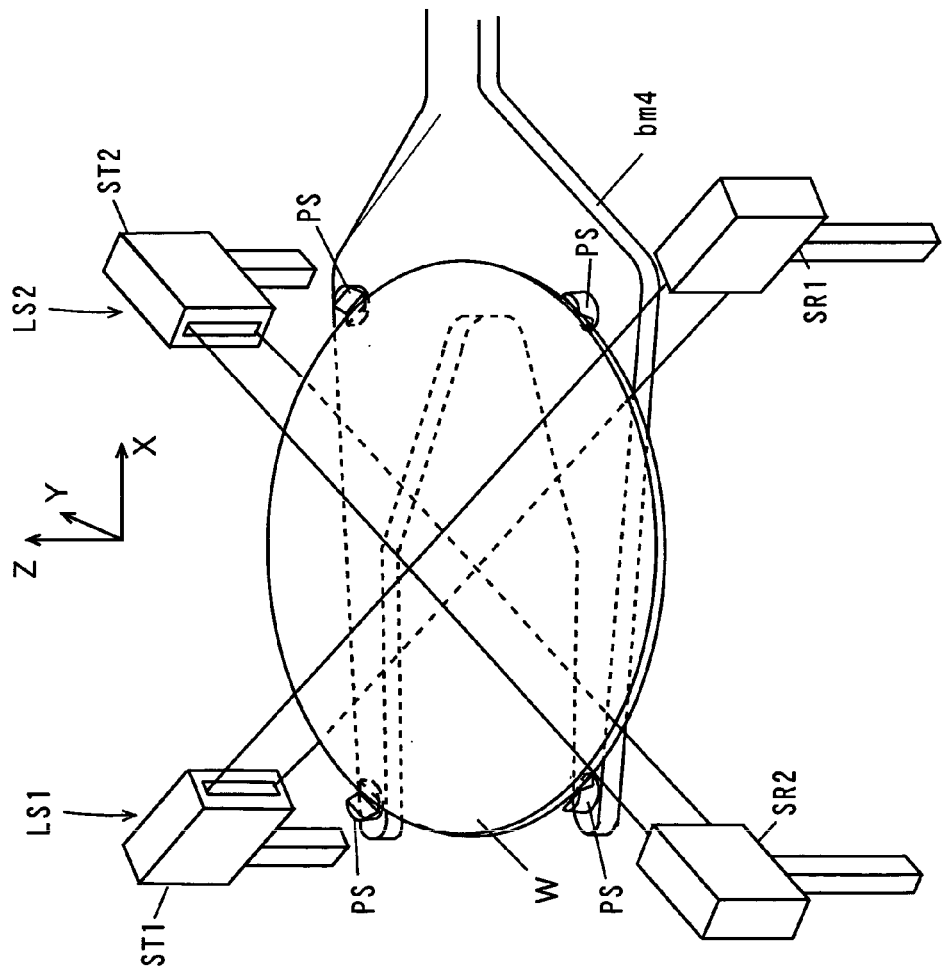
FIG. 18 is a perspective view showing a method for detecting the attitude of the substrate using optical length measuring sensors.
Figure 19:
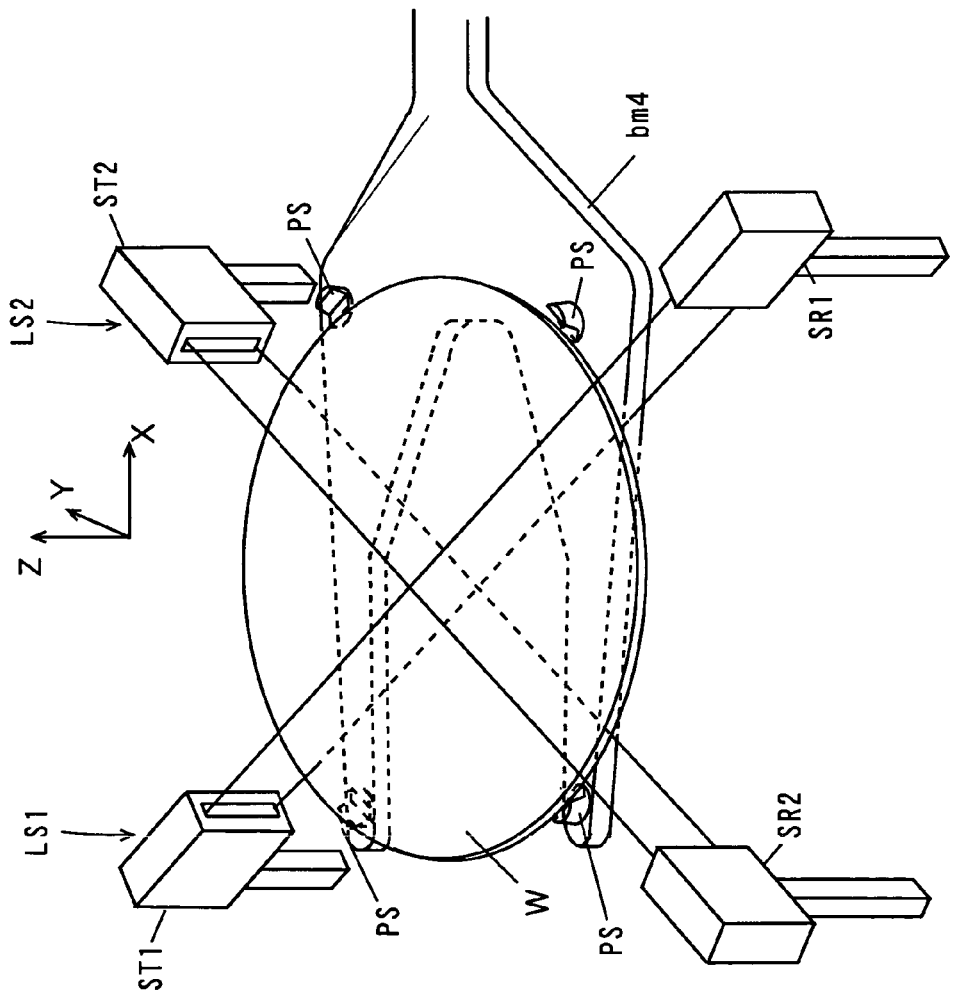
FIG. 19 is a perspective view showing a method for detecting the attitude of the substrate using optical length measuring sensors.

FIGS. 18 and 19 are perspective views showing a method for detecting the attitude of the substrate W using the optical length measuring sensors LS1, LS2. FIG. 18 shows the substrate W being normally supported by the transport arm bm4 and FIG. 19 shows the substrate W being supported in an inclined attitude by the transport arm bm4.

Figure 20:
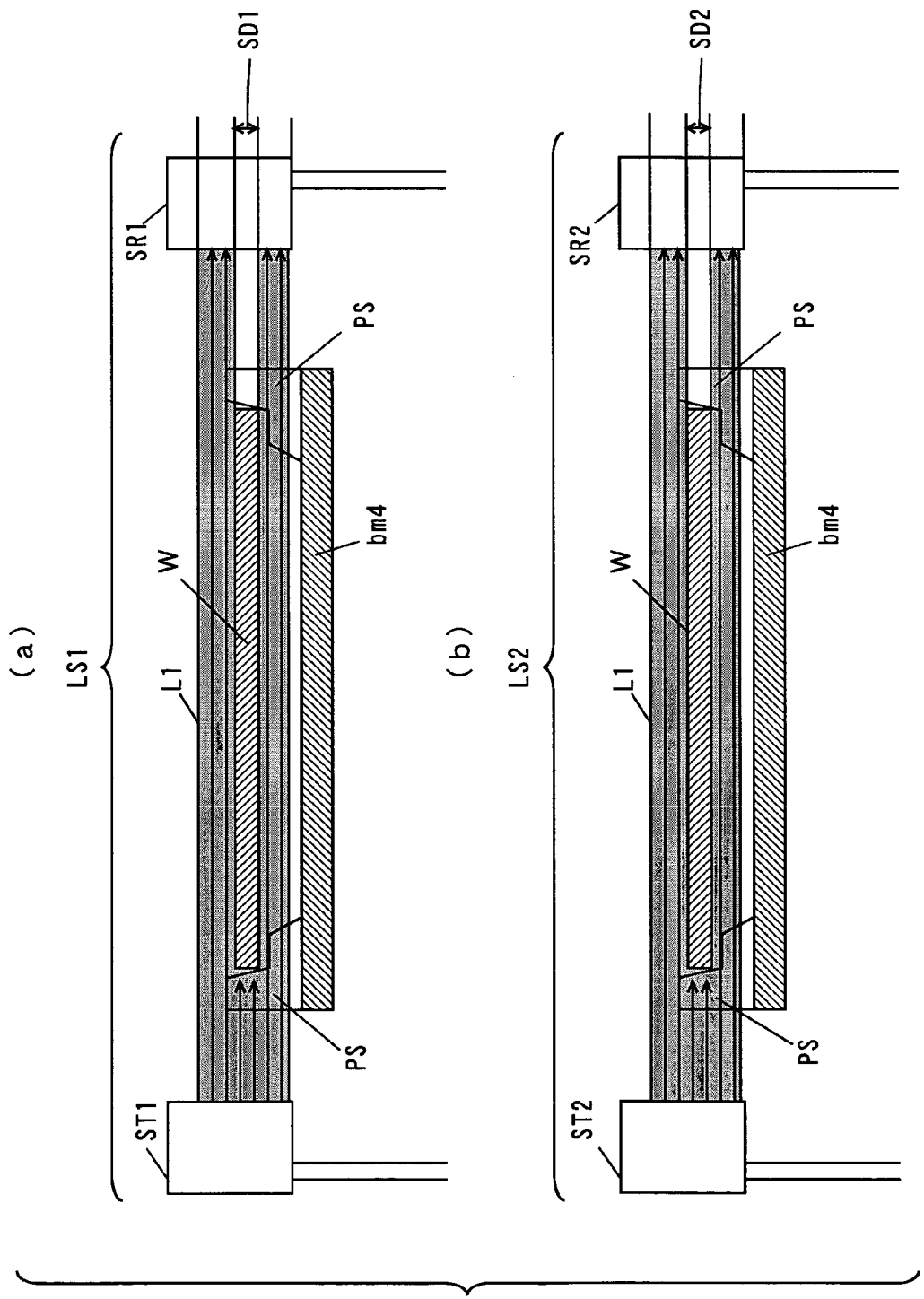
FIG. 20 is a cross-sectional view showing the method for detecting the attitude of the substrate using the optical length measuring sensors.
Figure 21:
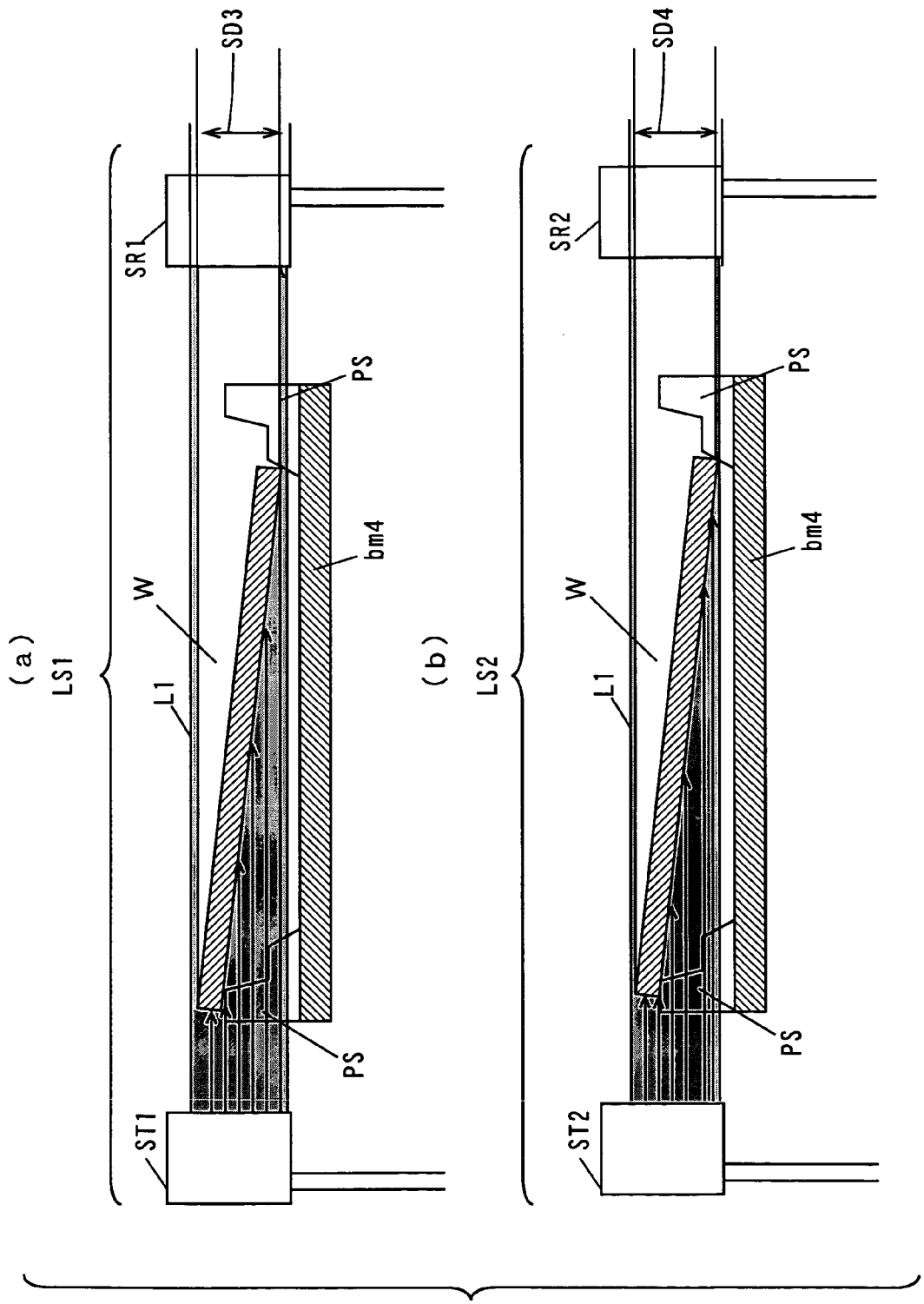
FIG. 21 is a cross-sectional view showing the method for detecting the attitude of the substrate using the optical length measuring sensors.

FIGS. 20 and 21 are cross-sectional views showing the method for detecting the attitude of the substrate W using the optical length measuring sensors LS1, LS2. FIG. 20 shows the substrate W being normally supported by the transport arm bm4, and FIG. 21 shows the substrate W being supported in an inclined attitude by the transport arm bm4. FIGS. 20(a) and 21(a) show the substrate W being detected by the optical length measuring sensor LS1, while FIGS. 20(b) and 21(b) show the substrate W being detected by the optical length measuring sensor LS2.

As shown in FIGS. 18 and 19, the optical length measuring sensors LS1, LS2 are arranged so that light beams emitted from the respective light emitters may cross at right angles at around the center of the substrate W.

In FIG. 18, the substrate 18 is normally supported in a substantially horizontal state by the planes PS3 of the four substrate supporters PS arranged on the top surface of the transport arm bm4. In this case, as shown in FIG. 20(a), a light beam L1 is emitted substantially in parallel from the light emitter ST1 of the optical length measuring sensor LS1, and the length of an area blocked by the substrate W is measured by the light receiver SR1 of the optical length measuring sensor LS1. Based on a difference between the amounts of emitted light and received light, the light receiver SR1 of the optical length measuring sensor LS1 supplies a measurement value SD1 to the controller CL.

Similarly, as shown in FIG. 20(b), the light receiver SR2 of the optical length measuring sensor LS2 measures the length of an area blocked by the substrate W. Based on the amounts of emitted light and received light, the light receiver SR2 of the optical length measuring sensor LS2 supplies a measurement value SD2 to the controller CL.

The controller CL calculates an angle $\theta 1$ of inclination, based on the measurement values SD1, SD2 supplied from the light receivers SR1, SR2 of the respective optical length measuring sensors LS1, LS2. The controller CL determines if the calculated angle $\theta 1$ of inclination is within a predetermined acceptable range. In the case of FIG. 18, since the angle $\theta 1$ of inclination of the substrate W is within the predetermined acceptable range, the controller CL determines that the substrate W is being normally supported by the transport arm bm4.

In FIG. 19, on the other hand, the substrate W is being supported by the planes PS1 and inclined planes PS4 of the four substrate supporters PS arranged on the top surface of the transport arm bm4 (see, FIG. 2(b), (c)). In this case, since the substrate W is in an inclined attitude as shown in FIG. 21(a), the light beam L1 emitted from the light emitter ST1 of the optical length measuring sensor LS1 is blocked by more than an original thickness of the substrate W. The light receiver SR1 of the optical length measuring sensor LS1 supplies a measurement value SD3 based on a difference between the amounts of emitted light and received light to the controller CL.

Similarly, as shown in FIG. 21(b), the light receiver SR2 of the optical length measuring sensor LS2 supplies a measurement value SD4 based on a difference between the amounts of emitted light and received light to the controller CL.

The controller CL calculates the angle $\theta 1$ of inclination, based on the measurement values SD3, SD4 supplied from the light receivers SR1, SR2 of the respective optical length measuring sensors LS1, LS2. The controller CL determines if the calculated angle $\theta 1$ of inclination for each substrate W is within a predetermined acceptable range. In the case of FIG. 19, since the angle $\theta 1$ of inclination of the substrate W is out of the predetermined acceptable range, the controller CL determines that the substrate W is being supported in an inclined attitude by the transport arm bm4.

Note that where the measurement value SD3 is greater than the measurement value SD4, the controller CL can determine that the substrate W is significantly inclined in the direction along the optical length measuring sensor LS1 relative to the direction along the optical length measuring sensor LS2.

Where the measurement value SD3 and the measurement value SD4 are equal, the controller CL can determine that the substrate W is significantly inclined in an intermediate direction between the direction along the optical length measuring sensor LS1 and the direction along the optical length measuring sensor LS2.

Where the controller CL determines that the substrate W is being supported in an inclined attitude by the transport arm bm4, the controller CL allows the transport arm bm4 of the substrate transport robot CR to move in the ±X direction so that the periphery of the substrate W may abut all of the positioning pins T1 to T4 in sequence. This results in correction of the inclined attitude of the substrate W.

Note that where the substrate W is normally (substantially horizontally) supported by the transport arm bm4 in advance, measurement values of the optical length measuring sensors LS1, LS2 may be measured as reference values SDR1, SDR2, and differences between the respective reference values and the measurement values SD3, SD4 (differential values SDR1-SD3, SDR2-SD4) may be calculated for the calculation of an angle $\theta 1$ of inclination based on the differential values SDR1-SD3, SDR2-SD4.

As discussed above, in the substrate processing apparatus 100a according to the third embodiment, the inclined attitude of the substrate W can be detected using the optical length measuring sensors LS1, LS2. Also, the controller CL can determine the inclined attitude of the substrate W based on the measurement values SD1, SD2. SD3, SD4 supplied from the optical length measuring sensors LS1, LS2.

Moreover, the controller CL in the substrate processing apparatus 100*a* can detect the inclined attitude of the substrate W based on the angle θ1 of inclination of the substrate W, and allow the substrate W in an inclined attitude to abut the positioning pins T1 to T4 in an optimum manner based on the detection result, thereby controlling the substrate transport robot CR to correct the substrate W in an inclined attitude to be in a normal state. This prevents dropping and breakage of the substrate W while preventing part of the substrate W from being left unprocessed. As a result, an increase in the cost can be suppressed.

In the embodiment, the inclined attitude of the substrate W is detected using the translucent optical length measuring sensors comprised of the light receivers and light emitters; however, sensors having any other optional detection systems may also be used without restricted to those described herein. Reverberatory optical length measuring sensors, for example, may be used instead.

Figure 22:
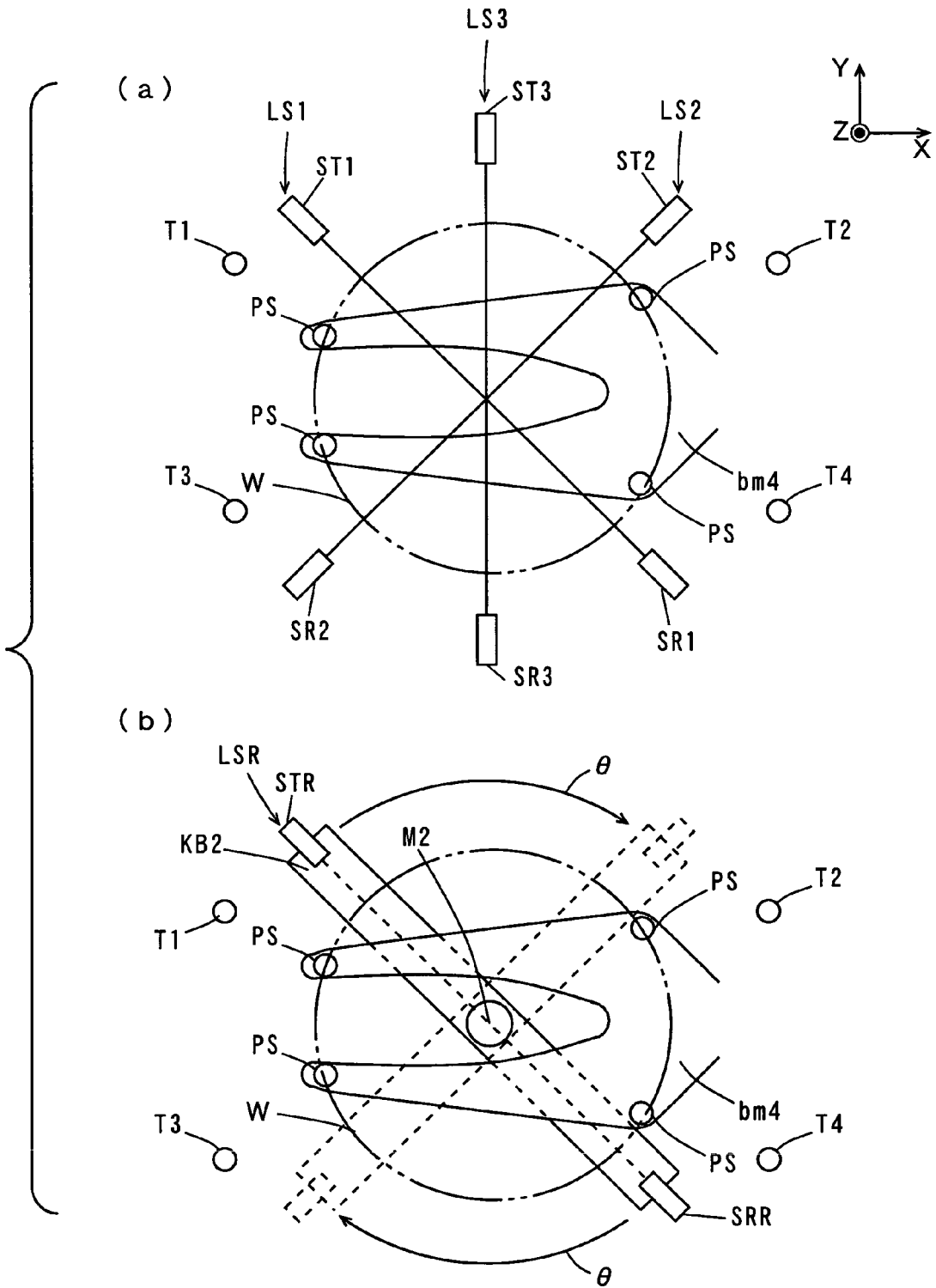
FIG. 22 is a schematic plan view showing an example of another arrangement of optical length measuring sensors.
Figure 23:
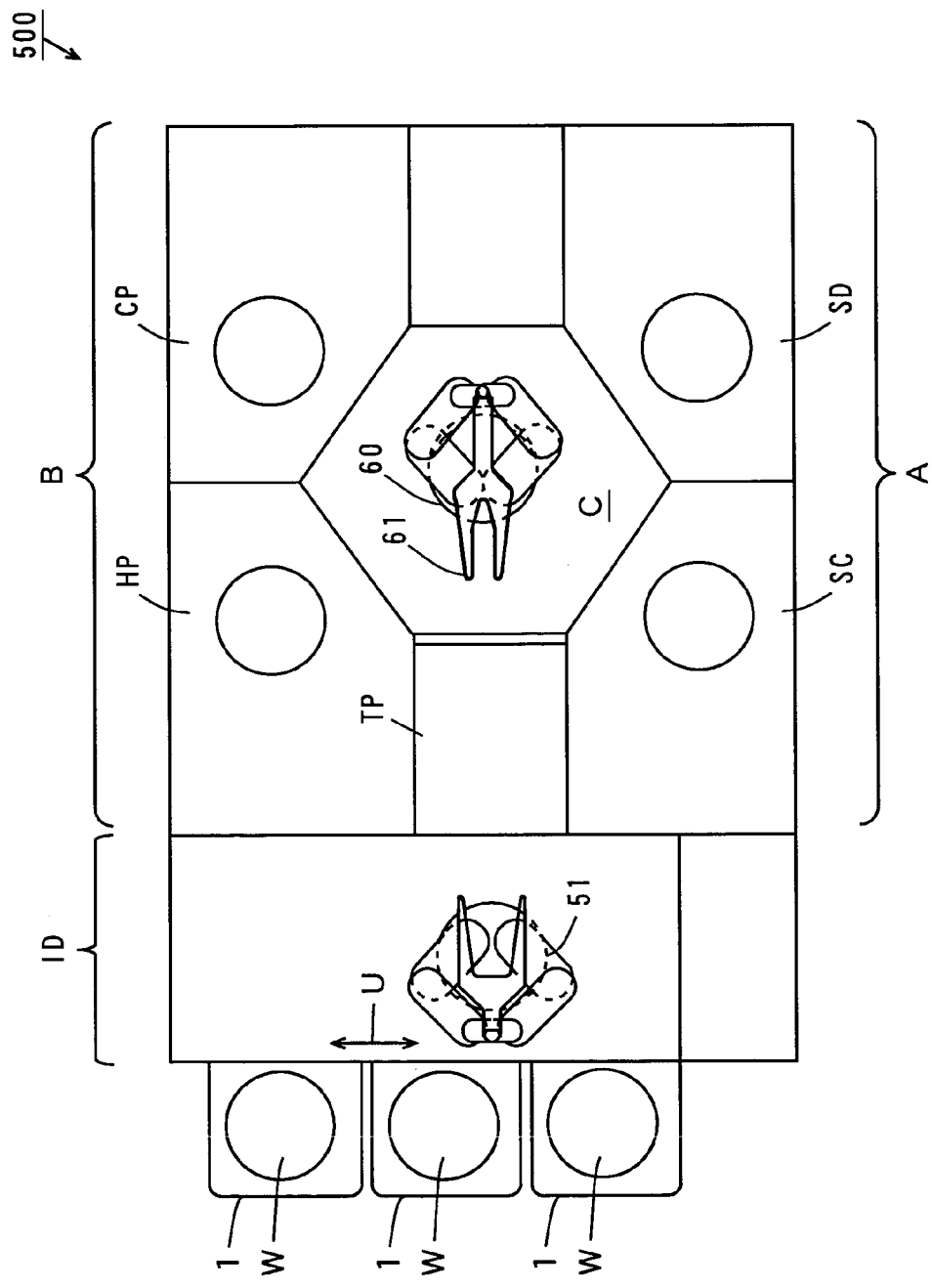
FIG. 23 is a perspective view showing an example of a conventional substrate processing apparatus.

FIG. 22 is a schematic plan view showing an example of another arrangement of optical length measuring sensors.

FIG. 22(*a*) shows a method for detecting an inclined attitude of a substrate W with the arrangement of three optical length measuring sensors; and FIG. 22(*b*) shows a method for detecting the attitude of a substrate W by rotation of an optical length measuring sensor.

In the example of FIG. 22(*a*), the two optical length measuring sensors LS1, LS2, and an additional optical length measuring sensor LS3 are provided, for more accurate detection of the inclined attitude of the substrate W.

In this case, the controller CL is supplied with three measurement values from the optical length measuring sensors LS1, LS2, LS3. As a result, the controller CL can more accurately determine the angle θ1 of inclination based on the three measurement values.

In FIG. 22(*b*), a motor M2 is fixed above the transfer portion TP with a fixed rotary plate KB2 mounted around the rotation axis of the motor M. A light emitter STR and a light receiver SRR of an optical length measuring sensor LSR are mounted in the vicinity of the periphery of the fixed rotary plate KB2. As the rotation axis of the motor M2 rotates in the ±θ direction (rotating direction around the vertical axis Z), the fixed rotary plate KB2 also rotates so that the optical length measuring sensor LSR mounted in the fixed rotary plate KB2 rotates around the periphery of the substrate W.

In this case, the controller CL instructs the optical length measuring sensor LSR rotating around the periphery of the substrate W to supply measurement values on a plurality of arbitrary positions at predetermined timings (for example, each time the optical length measuring sensor LSR rotates 120 degrees in the +θ direction). The optical length measuring sensor LSR supplies the controller CL with the measurement values on the plurality of arbitrary positions in the substrate W, in accordance with an instruction of the controller CL.

As a result, the controller CL can more accurately determine an angle θ1 of inclination.

Further, in the structure shown in FIG. 22(*b*), it is not necessary to arrange a plurality of optical length measuring sensors, thereby preventing potential mutual interference of lights among the plurality of optical length measuring sensors, while reducing the numbers of components and assembly steps, thus leading to reduced cost in total.

In the third embodiment, the cleaning units MP1 to MP4 correspond to a plurality of processing units; the transfer portion TP corresponds to a transfer position; the ultrasonic distance measuring sensors TS1, TS2, TS3 correspond to detectors; the indexer robot IR, transport arm am4, and substrate supporters PS correspond to first transport devices; the substrate transport robot CR, transport arm bm4, and substrate supporters PS correspond to second transport devices; the positioning pins T1, T2, T3, T4 correspond to a correction mechanism or abutting members; the optical length measuring sensors LS1, LS2, LS3, LSR correspond to detectors; the controller CL corresponds to a controller; and the cleaning unit corresponds to a processing unit.

(Others)

In each of the first and second embodiments, description has been made of a case where the inclined attitude of the substrate W is corrected based on the direction H of inclination of the substrate; however, as in the third embodiment, in the first and second embodiments also, where the controller CL determines that the substrate W is in an inclined attitude, the controller CL may correct the inclined attitude of the substrate W by allowing the periphery of the substrate W to abut all of the positioning pins T1 to T4.

Note that in the above first and second embodiments, the inclined attitude of the substrate W is corrected by allowing the substrate W in an inclined attitude to abut the positioning pins T1 to T4; however, correction of the attitude of the substrate may also be made, for example, in the following method using the transport arm am4 of the indexer robot IR. First, the substrate W being held in an inclined attitude above the transport arm bm4 of the substrate transport robot CR is temporally held by the transport arm am4 of the indexer robot IR. Relative position of the transport arm am4 and the transport arm bm4 in the horizontal direction is then corrected based on inclined states (direction H of inclination or angle θ1 of inclination) of the substrate W supplied from the ultrasonic distance measuring sensors TS1, TS2, TS3, and the substrate W is again transferred from the transport arm am4 of the indexer robot IR to the transport arm bm4 of the substrate transport robot CR.

Note that the distance from the substrate transport robot CR to the transport arm bm4 may be measured using the ultrasonic distance measuring sensors TS1, TS2, TS3 when the transport arm bm4 is not supporting the substrate W, so as to adjust the operation of the transport arm bm4.

In the above embodiments, the attitude of the substrate W is corrected by allowing the substrate W to abut the positioning pins T1 to T 4 where the direction H of inclination of the substrate W is in the −X and +X directions; however, considering a case where the inclined attitude of the substrate W is in the −X and +X directions, two to four additional positioning pins may further be provided in the ±Y direction viewed from the substrate W shown in FIG. 8, so that the substrate W may abut the positioning pins.

Note that in the second embodiment, the ultrasonic distance measuring sensors TS1, TS2, TS3, and the positioning pins T1 to T4 are provided in the cleaning unit MP3; however, the ultrasonic distance measuring sensors and the positioning pins may be provided in any of other cleaning units MP1, MP2, MP4.

Further, in the above embodiment, the plurality of single-processing type cleaning units MP1 to MP4 are arranged as the processing units in the processing regions A, B; however, various other optional processing units, such as a hot plate for performing heat processing, a cooling plate for performing cooling processing, a spin developing device (spin developer) for performing developing processing, a spin coating unit (spin coater) for performing resist coating processing, a resist stripping unit for performing resist stripping processing, and a polymer removing unit for removing polymer such as organic metals, may alternatively be provided in desired combination.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A substrate detecting apparatus for detecting an inclined state of a substrate with respect to a horizontal plane, comprising:

a supporting device that supports a substrate; and a detector that detects said inclined state of the substrate by measuring a distance to the surface of the substrate supported by said supporting device, said detector including:

a distance measuring sensor that measures as reference values distances to at least three measurement points on the surface of the substrate substantially horizontally supported by said supporting device, and subsequently measures as measurement value distances to said at least three measurement points on the surface of the substrate supported by said supporting device; and a determiner that calculates differences between the reference values obtained from said distance measuring sensor and the measurement values obtained from said distance measuring sensor respectively and determines the inclined state of the substrate based on said differences for said at least three measurement points wherein said detector detects an angle of inclination of the substrate as the inclined state of the substrate supported by said supporting device; further comprising a second determiner that determines that the inclined state of the substrate is abnormal when the angle detected by said detector is not less than a predetermined value.

2. The substrate detecting apparatus according to claim 1, wherein said detector includes an ultrasonic distance measuring sensor.

3. The substrate detecting apparatus according to claim 1, wherein said detector includes a laser distance measuring sensor.

4. The substrate detecting apparatus according to claim 1, wherein said detector includes a microwave distance measuring sensor.

5. The substrate detecting apparatus according to claim 1, wherein said detector includes three or more distance measuring sensors that measure the distances to the surface of the substrate supported by said supporting device.

6. The substrate detecting apparatus according to claim 1, wherein said detector includes:

a distance measuring sensor that measures the distance to the surface of the substrate supported by said supporting device; and a moving device that moves said distance measuring sensor relative to the substrate supported by said supporting device.

7. The substrate detecting apparatus according to claim 1, wherein said detector detects the presence/absence of an inclination of the substrate as the inclined state of the substrate supported by said supporting device.

8. The substrate detecting apparatus according to claim 1, wherein said detector detects a direction of inclination of the substrate as the inclined state of the substrate supported by said supporting device.

9. The substrate detecting apparatus according to claim 1, further comprising a correction mechanism that corrects a state of the substrate supported by said supporting device based on the inclined state of the substrate detected by said detector.

10. The substrate detecting apparatus according to claim 9, wherein said correction mechanism includes:

an abutting member; and a controller that corrects the inclined state of the substrate supported by said supporting device by allowing the substrate supported by said supporting device to abut said abutting member.

* * * * *

UNITED STATES PATENT AND TRADEMARK OFFICE
CERTIFICATE OF CORRECTION

PATENT NO. : 7,596,425 B2
APPLICATION NO. : 10/860267
DATED : September 29, 2009
INVENTOR(S) : Fuminori Asa It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1154 days.

Signed and Sealed this

Twenty-eighth Day of September, 2010

David J. Kappos
*Director of the United States Patent and Trademark Office*